United States Patent [19]
Matsumoto et al.

[11] Patent Number: 5,726,479
[45] Date of Patent: Mar. 10, 1998

[54] SEMICONDUCTOR DEVICE HAVING POLYSILICON ELECTRODE MINIMIZATION RESULTING IN A SMALL RESISTANCE VALUE

[75] Inventors: Michikazu Matsumoto, Osaka; Minoru Fujii, Hyogo; Toshiki Yabu, Osaka, all of Japan

[73] Assignee: Matsushita Electric Industrial Co., Ltd., Osaka, Japan

[21] Appl. No.: 584,123

[22] Filed: Jan. 11, 1996

[30] Foreign Application Priority Data

Jan. 12, 1995 [JP] Japan ................... 7-003012
Jun. 30, 1995 [JP] Japan ................... 7-164976

[51] Int. Cl.$^6$ ................... H01L 29/76; H01L 29/94
[52] U.S. Cl. ................... 257/412; 257/344; 257/413; 257/383; 257/384; 257/388; 257/903; 437/41; 437/44; 437/913
[58] Field of Search ................... 257/383, 384, 257/412, 413, 344, 903; 437/41, 44, 913

[56] References Cited

U.S. PATENT DOCUMENTS

| | | | |
|---|---|---|---|
| 4,102,733 | 7/1978 | De La Moneda et al. | 257/413 |
| 4,374,700 | 2/1983 | Scott et al. | 257/377 |
| 4,821,085 | 4/1989 | Haken et al. | 257/412 |
| 4,912,061 | 3/1990 | Nasr | 257/413 |
| 4,994,873 | 2/1991 | Madan | 257/903 |
| 5,234,850 | 8/1993 | Liao | 257/344 |
| 5,241,207 | 8/1993 | Toyoshima et al. | 257/384 |
| 5,256,894 | 10/1993 | Shino | 257/388 |
| 5,397,722 | 3/1995 | Bashir et al. | |

FOREIGN PATENT DOCUMENTS

| | | |
|---|---|---|
| 4-48657 | 2/1992 | Japan . |
| 5-136398 | 6/1993 | Japan . |
| 5-112219 | 4/1994 | Japan . |

Primary Examiner—Valencia Martin Wallace
Attorney, Agent, or Firm—McDermott, Will & Emery

[57] ABSTRACT

A polysilicon electrode is formed in an active area surrounded by an isolation on a silicon substrate with a gate oxide film sandwiched therebetween, a polysilicon wire is formed on the isolation, and a source/drain region is formed on both sides of the polysilicon electrode. On the both sides of a polysilicon film constituting the electrode and the wire are formed side walls having a height that is 4/5 or less of the height of the polysilicon film. Furthermore, the polysilicon film is provided with a silicide layer in contact with the top surface and portions of the side surfaces of the polysilicon film projecting from the side walls, and another silicide layer is formed in contact with the source/drain region. Since the sectional area of the silicide layer is increased, the resistance value can be suppressed even when the dimension of the polysilicon film is minimized. Thus, the invention provides a semiconductor device including an FET having a low resistance value applicable to a refined pattern.

18 Claims, 23 Drawing Sheets

SEMICONDUCTOR DEVICE HAVING POLYSILICON ELECTRODE MINIMIZATION RESULTING IN A SMALL RESISTANCE VALUE

BACKGROUND OF THE INVENTION

The present invention relates to a semiconductor device mounting an FET having a silicidated electrode and a production method for the semiconductor device, and more particularly, it relates to decrease of a resistance value in the semiconductor device.

Recently, elements used in the field of VLSI have become more and more minimized and refined, and have attained a higher speed operation with smaller power consumption. In order to achieve such properties of the elements, resistance of a polysilicon electrode, a polysilicon wire and a source/drain diffused layer of a MOS transistor is reduced so as to reduce the capacity of the source/drain diffused layer in the production procedure of a VLSI circuit. One of known techniques for decreasing resistance of a polysilicon gate electrode and a source/drain region or resistance of a polysilicon wire of a MOS transistor is designated as a silicide process using silicide, that is, a compound of silicon and a metal. A semiconductor device produced through this silicide process can realize, owing to the decrease of the resistance of a source/drain region, a minimized area of the source/drain region, decrease of the parasitic capacity of the source/drain region and a high speed operation of the resultant VLSI circuit.

As an example of the silicide process, a so-called salicide (self aligned silicide) process has been developed. In the salicide process, a MOS transistor has a structure including a gate electrode composed of a lower polysilicon electrode and an upper silicide layer, and another silicide layer in contact with a source/drain region. In the production of such a MOS transistor, the polysilicon electrode and the source/drain region are simultaneously silicidated. Therefore, in the salicide process, the gate electrode and the source/drain region can be silicidated in one and the same step, and hence, the number of required steps and the production cost can be reduced. Because of these advantages, the salicide process is regarded to be a useful process for refining an element, and more and more studies and developments have been made on this process.

Now, a conventional salicide structure and the conventional salicide process will be described referring to FIGS. 22 and 23(a) through 23(f).

FIG. 22 shows an exemplified sectional structure of a MOS transistor having the conventional salicide structure. In the MOS transistor of FIG. 22, respective reference numerals are used to refer to the following elements: A reference numeral 1 denotes a silicon substrate. A reference numeral 2 denotes an isolation provided for surrounding and electrically separating active areas of respective MOS transistors formed on the semiconductor substrate 1 from one another. A reference numeral 3 denotes a gate oxide film. A reference numeral 4a denotes a polysilicon electrode formed on the active area and functioning as a gate, and a reference numeral 4b denotes a polysilicon wire formed on the isolation 2 and functioning as a wire. Both the polysilicon electrode 4a and the polysilicon wire 4b are formed out of polysilicon films simultaneously deposited. A reference numeral 5 denotes a protection oxide film for protecting the polysilicon electrode 4a and the like. A reference numeral 6 denotes a low concentration source/drain region formed by doping with an impurity at a low concentration for relaxing a local electric field during the operation of the transistor so as to improve its reliability. A reference numeral 7 denotes a side wall, which is used as a mask for ion injection in forming a high concentration source/drain region when a so-called LDD structure is adopted. A reference numeral 8 denotes a high concentration source/drain region formed by doping with an impurity at a high concentration. The high concentration source/drain region 8 corresponds to an n+region where, for example. As or the like is injected, in an N-channel transistor, and corresponds to a p+region, where $BF_2$ or the like is injected, in a P-channel transistor. A reference numeral 9a denotes an electrode silicide film formed on the polysilicon electrode 4a, a reference numeral 9b denotes a wire silicide layer formed on the polysilicon wire 4b, and a reference numeral 9c denotes a substrate silicide layer formed on the high concentration source/drain region 8. The silicide layers 9a through 9c are simultaneously formed by silicidating portions close to the surfaces of the polysilicon electrode 4a, the polysilicon wire 4b and the high concentration source/drain region 8 in the salicide process. A typical silicide material can be $TiSi_2$, and other examples of the material include $CoSi_2$, $NiSi$, $WSi$ and $PtSi_2$.

In the semiconductor device having the structure as shown in FIG. 22, the resistance values of the polysilicon electrode 4a, the polysilicon wire 4b and the high concentration source/drain region 8 can be suppressed because of the silicide layers 9a through 9c respectively formed in contact with these elements. In a semiconductor device, for example, comprising a polysilicon electrode and a polysilicon wire bearing no silicide layer, when it is assumed that a polysilicon film has a thickness of 330 nm, the sheet resistance value of the polysilicon film is approximately 30ω/□ even when the polysilicon film is doped with phosphorus. In contrast, the sheet resistance value of the polysilicon film including the silicide layers 9a and 9b of FIG. 22 can be reduced to be lower than 3ω/□. Furthermore, the sheet resistance value of the high concentration source/drain region 8 including the substrate silicide layer 9c can be reduced from approximately 100ω/□, which is a sheet resistance value when the silicide layer is not provided, to a value smaller than 3ω/□. In addition, in the MOS transistor having the salicide structure, a contact resistance can be reduced to a value of ⅟10 of that of a MOS transistor having a non-salicide structure. This is because, although not shown in FIG. 22, the polysilicon wire 4b and the high concentration source/drain region 8 are connected to wire metal for interconnecting transistors by means of a junction between wire metal and a silicide layer, while they are connected by means of a junction between wire metal and silicon in a transistor of a non-salicide structure.

As described above, by silicidating the upper portions of the polysilicon electrode 4a, the polysilicon wire 4b and the high concentration source/drain region 8, the resistance values thereof can be decreased. This results in minimization and refinement of wires and elements in a semiconductor device, and a rapid operation and low power consumption of the device.

The production method for a MOS transistor having the conventional salicide structure will now be described referring to FIGS. 23(a) through 23(f).

First, as is shown in FIG. 23(a), the gate oxide film 3 and the polysilicon electrode 4a are formed in the active area surrounded by the isolation 2 around the surface of the silicon substrate 1, and the entire surface of the resultant substrate 1 is covered with the protection oxide film 5. At this point, also on the isolation 2 are formed the polysilicon wire 4b, which is deposited and patterned simultaneously with the polysilicon electrode 4a, and the protection oxide film 5. Then, by using the gate electrode 4a and the protection oxide film 5 as masks, impurity ions are injected into the active area of the silicon substrate 1 at a low concentration, thereby forming the low concentration source/drain region 6. After this, the side walls 7 are formed on the both sides of the polysilicon electrode 4a and the polysilicon wire 4b by anisotropic etching of a thick oxide film deposited by the chemical vapor deposition method (CVD). FIG. 23(a) shows the sectional view of the resultant substrate 1 at time when the formation of the side walls 7 is completed.

Then, as is shown in FIG. 23(b), by using the polysilicon electrode 4a and the side walls 7 as masks, the impurity ions are injected into the active area of the silicon substrate 1 at a high concentration, thereby forming the high concentration source/drain region 8.

Next, as is shown in FIG. 23(c), the protection oxide film 5 remaining on the polysilicon electrode 4a, the polysilicon wire 4b and the high concentration source/drain region 8 is removed by wet etching, so as to expose the surfaces of the polysilicon film and the silicon substrate. Then, a metal film 10 (for example, a titanium film) is deposited on the entire surface of the resultant substrate 1 by the sputtering method.

Then, as is shown in FIG. 23(d), the resultant substrate 1 is subjected to a rapid thermal annealing (RTA) treatment at a temperature of 600° C. to 700° C., thereby allowing silicon contained in the polysilicon electrode 4a, the polysilicon wire 4b and the high concentration source/drain region 8 to react with titanium, so as to form silicide layers 11a through 11c made of $TiSi_2$ films. At this point, the titanium film 10 on the isolation 2 and the side walls 7 is not silicidated owing to the absence of silicon therebelow but remains to be formed out of unreacted titanium.

Next, as is shown in FIG. 23(e), the resultant substrate 1 is subjected to the wet etching, thereby selectively removing merely the titanium film 10 made of unreacted titanium remaining on the isolation 2 and the side walls 7, while maintaining the silicide layers 11a through 11c. A typically used selective wet etching solution is an aqueous solution of hydrogen peroxide including ammonia or sulfuric acid, or the like.

It is noted that the $TiSi_2$ films (C49) constituting the silicide layers 11a through 11c have rather high resistivity because they are formed through the annealing treatment at a comparatively low temperature (i.e., 600° C. to 700° C.). Therefore, as is shown in FIG. 23(f), in order to further decrease the resistance of the silicide ($TiSi_2$) layers 11a through 11c, a second RTA treatment is performed at a comparatively high temperature of 750° C. to 850° C., thereby forming the silicide layers 9a through 9c made of $TiSi_2$ films (C54) with low resistivity. Thereafter, although the sectional view of the substrate in the subsequent procedure is not shown, an interlayer insulating film is deposited and flattened, a contact hall is formed, a metal wire film is deposited, and a metal wire is formed, so as to complete an LSI.

Through the aforementioned procedure, the MOS transistor having the salicide structure as shown in FIG. 22 can be produced.

The salicide process has been developed and practically used for improving the performance of a VLSI as described above. As a VLSI becomes more and more refined and the design rule is progressively refined to 0.35 μm or 0.25 μm, the width of a polysilicon electrode and a polysilicon wire on the isolation is also minimized to 0.35 μm or 0.25 μm. As a result, there arises a problem that, although a resistance value per unit area (i.e., a sheet resistance value) of the polysilicon film is not varied as the width of the polysilicon electrode 4a and the polysilicon wire 4b is minimized, the resistance value of the polysilicon film itself is increased in proportion to the inverse of the width thereof.

In particular, a $TiSi_2$ film, which is most commonly used as a silicide material and is most easily used in the process, is disadvantageous in view of this problem. This is because when the width of the polysilicon film is smaller than 1.0 μm, the resistance value per unit area (the sheet resistance value) of the $TiSi_2$ film is largely increased. Therefore, when the design rule is refined to 0.35 μm or 0.25 μm in using the $TiSi_2$ film, the sheet resistance value of a wire with a minimum width of 0.35 μm or 0.25 μm is very large as compared with the sheet resistance value of a wire with a width exceeding 1.0 μm. As a result, the effectivity as a silicide LSI wire cannot be exhibited (See Nikkei Microdevice, June issue, 1994, pp. 52–59). In using other materials with a high melting point other than $TiSi_2$, such as $CoSi_2$ and NiSi, the resistance values per unit area (the sheet resistance value) of these materials are comparatively less increased by the minimization of the width. However, when the width is further decreased, there possibly arises the same problem of the increase of the resistance value, and additionally these materials also have another problem of difficulty in practical use.

SUMMARY OF THE INVENTION

The present invention was devised to solve the aforementioned problems, and the objective is providing, as a structure or a production method for a semiconductor device mounting a transistor having a silicide layer on a polysilicon electrode, a semiconductor device having an extremely small resistance value applicable to minimization of the dimension of a polysilicon electrode and the like, and a production method for the same.

In order to achieve the objective, not only the top surface of a polysilicon film but also part of the side surfaces thereof are silicidated in this invention, thereby reducing the resistance value.

Specifically, the first semiconductor device of this invention comprises an active area formed in a part of a semiconductor substrate; an isolation for surrounding the active area; a line-like polysilicon film formed at least on the active area and serving as a gate electrode on the active area; a pair of side walls formed on both side surfaces of the polysilicon film and made of an insulating film having a height of ⅘ or less of a height of the polysilicon film; a silicide layer formed in contact with a top surface and portions of the side surfaces of the polysilicon film projecting from the side walls, and serving as the gate electrode on the active area together with the polysilicon film; and a source/drain region formed on the active area so as to be positioned on both sides of the polysilicon film.

By adopting this structure in which not only the top surface but also part of the side surfaces of the polysilicon film are provided with the silicide layer, the resistance value of the gate electrode formed out of the silicide layer and the polysilicon film can be decreased. Accordingly, even when the dimension of the gate electrode is minimized, a sufficiently small resistance value can be obtained.

In the first semiconductor device, the following preferred embodiments can be adopted:

The polysilicon film is formed on the active area and the isolation, and the polysilicon film on the isolation and the silicide layer on the isolation together form a wire.

In this structure, the resistance value of the wire, which occupies a larger area than the gate electrode, can be reduced.

The portions of the polysilicon film projecting from the side walls have a height to minimum linewidth ratio of ½ or more, and the silicide layer is formed by allowing silicidated portions from the both side surfaces of the polysilicon film to come in contact with each other at the center of a top surface of the polysilicon film.

In this structure, the electric resistance value can be reduced when the gate electrode is further refined.

The semiconductor device further comprises a second silicide layer formed in contact with the source/drain region.

In this structure including the second silicide layer formed in contact with the source/drain region, which corresponds to a so-called salicide structure, the resistance value of the whole device can be suppressed even when the semiconductor device is refined. Thus, the advantage of the salicide structure cannot be spoiled.

The isolation is a trench type isolation, and the top surface of the isolation is higher in a step-wise manner than a top surface of the semiconductor substrate in the active area.

In this structure, the isolation function of the isolation can be prevented from degrading due to the decrease of its thickness during the formation of the side walls, and hence, it is possible to easily form the side walls having a smaller height than the height of the polysilicon film. Accordingly, the production procedure for the semiconductor device can be stabilized, improving the yield and the reliability thereof.

The polysilicon film has a double-layer structure, at least in the active area, including a first polysilicon film and a second polysilicon film deposited on the first polysilicon film, and the side walls have a height smaller than a total thickness of the first polysilicon film and the second polysilicon film.

In this structure, it is possible to appropriately adjust properties such as impurity concentrations in the first and second polysilicon films in accordance with the application and the kind of the semiconductor device.

On the isolation is formed a wire made of the second polysilicon film alone, and the top surface of the isolation is positioned at substantially the same height as a top surface of the first polysilicon film on the active area.

In this structure, the groundwork of the second polysilicon film is flat, and hence, the patterning accuracy in the formation of the polysilicon film can be improved. In other words, even when the semiconductor device is refined, a high dimension accuracy for the gate electrode can be attained.

The first polysilicon film is doped with a first conductivity type impurity at a high concentration, and the second polysilicon film is doped with the first conductivity type impurity at a low concentration.

In this structure, not only the resistance value of the first polysilicon film is decreased but also the second polysilicon film can be silicidated with ease. Accordingly, the total resistance value of the polysilicon films can be largely decreased.

The side walls are made of a silicon nitride film represented by a general formula of $Si_xN_y$, and a protection oxide film is interposed between the silicon nitride film, and the polysilicon film or the semiconductor substrate.

In this structure, since the etch selectivity between the silicon nitride film and the oxide film is high, the decrease of the thickness of the isolation during the formation of the side walls can be suppressed to be as small as possible. This improves the isolation function.

The second semiconductor device of this invention comprises an active area formed in a part of a semiconductor substrate; an isolation for surrounding the active area; a line-like polysilicon film formed at least on the active area and serving as a gate electrode on the active area; a pair of electrode side walls made of L-shaped insulating films with a substantially constant thickness including vertical portions formed on side surfaces of the polysilicon film and horizontal portions extending from bottoms of the vertical portions in an opposite direction of the polysilicon film; a silicide layer formed in contact with a top surface of the polysilicon film and portions of the side surfaces of the polysilicon film projecting from the side walls, and serving as the gate electrode together with the polysilicon film; and a source/drain region formed in the active area so as to be positioned on both sides of the polysilicon film.

By adopting this structure, the height of the side walls can be easily controlled. Accordingly, the effect attained by the first semiconductor device can be achieved more definitely.

Also in the second semiconductor device, the aforementioned preferred embodiments of the first semiconductor device can be adopted.

The first production method for a semiconductor device of this invention comprises a first step of forming an isolation in an area close to a surface of a semiconductor substrate so as to surround an active area; a second step of forming a gate insulating film in the active area on the semiconductor substrate; a third step of depositing a plate-like polysilicon film on the gate insulating film and the isolation; a fourth step of forming a line-like polysilicon film at least on the active area by selectively removing the plate-like polysilicon film by etching; a fifth step of depositing an insulating film for a side wall on the semiconductor substrate bearing the line-like polysilicon film; a sixth step of forming side walls on both sides of the line-like polysilicon film by etching back the insulating film for a side wall, the side walls having a height that is ⅘ or less of a height of the line-like polysilicon film; a seventh step of forming a source/drain region by introducing impurity into the semiconductor substrate so as to be positioned on the both sides of the line-like polysilicon film in the active area; an eighth step of depositing a metal film on the entire surface of the substrate in which a top surface of the line-like polysilicon film and portions of side surfaces thereof projecting from the side walls are exposed; a ninth step of forming a silicide layer in contact with the top surface and the portions of the side surfaces of the line-like polysilicon film by allowing the metal film to react with the exposed portions of the line-like polysilicon film through a high temperature annealing treatment; and a tenth step of removing an unreacted portion of the metal film.

By this production method, the first semiconductor device can be produced with ease.

In the first production method, the following preferred embodiments can be adopted:

The line-like polysilicon film is formed on the active area and the isolation in the fourth step.

The side walls are formed so that the portions of the side surfaces of the line-like polysilicon film projecting from the side walls have a height to minimum linewidth ratio of ½ or more in the sixth step, and the silicide layers proceeding from the side surfaces of the line-like polysilicon film are allowed to come in contact with each other at the center of the top surface of the line-like polysilicon film so that the portions of the side surfaces of the line-like polysilicon film projecting from the side walls are entirely silicidated in the ninth step.

The metal film is deposited with a surface of the source/drain region exposed in the eighth step, and a second silicide layer in contact with the source/drain region is simultaneously formed in the ninth step.

In the sixth step in particular, after the side walls are formed so as to have a height substantially equal to a thickness of the line-like polysilicon film by anisotropic dry etching, isotropic etching is conducted so as to reduce the height of the side walls.

In this method, the decrease of the thickness of the isolation in the sixth step can be suppressed to be as small as possible by making use of a characteristic of wet etching that the etch selectivity between the side walls and the isolation can be increased.

A silicon nitride film represented by a general formula of $Si_xN_y$ is deposited as the insulating film for a side wall in the fifth step, and the method is further provided with a step of depositing a protection oxide film at least on the line-like polysilicon film and the surface of the semiconductor substrate between the fourth step and the fifth step.

The first step includes steps of depositing an etching stopper film on the semiconductor substrate; forming a mask having an opening corresponding to an area for the isolation on the etching stopper film, conducting etching by using the mask so as to remove part of the etching stopper film corresponding to the opening of the mask, and then forming a trench by trenching part of the semiconductor substrate from the surface of the semiconductor substrate by a predetermined depth; depositing an insulating film for embedding the trench on the semiconductor substrate bearing the trench; etching back the insulating film for embedding the trench and substantially flattening the surface of the semiconductor substrate so as to expose at least a surface of the etching stopper film; and selectively removing the etching stopper film. The insulating film for embedding the trench that has remained in the trench forms trench type an isolation having a top surface that is higher in a step-wise manner than the top surface of the semiconductor substrate in the active area.

In this method, even in the case where the thickness of the isolation is decreased in the sixth step, the isolation function can be avoided from degrading if a step is previously provided in anticipation of the decrease. Accordingly, the condition for the sixth step can be selected in a wider range, resulting in easy production of the semiconductor device.

The first step includes steps of depositing an underlying polysilicon film on the semiconductor substrate; forming a mask having an opening corresponding to an area for the isolation on the underlying polysilicon film, conducting etching by using the mask so as to remove part of the underlying polysilicon film corresponding to the opening of the mask, and then forming a trench by trenching part of the semiconductor substrate from the surface thereof by a predetermined depth; depositing an insulating film for embedding the trench on the semiconductor substrate bearing the trench; and etching back the insulating film for embedding the trench and substantially flattening the surface of the semiconductor substrate so as to expose at least a surface of the underlying polysilicon film. The insulating film for embedding the trench that has remained in the trench forms trench type an isolation having a top surface that is higher in a step-wise manner than the top surface of the semiconductor substrate in the active area. The second step is conducted before the step of depositing the underlying polysilicon film of the first step. The plate-like polysilicon film is deposited on the underlying polysilicon film and the trench type an isolation in the third step. The line-like polysilicon film in the active area is formed out of the underlying polysilicon film and the plate-like polysilicon film, and the line-like polysilicon film on the trench type an isolation is formed out of the plate-like polysilicon film alone.

In this method, the accuracy in patterning the gate electrode can be improved.

In the sixth step, after forming the side walls having a height substantially equal to the thickness of the line-like polysilicon film through anisotropic dry etching, the height of the side walls is reduced by further conducting anisotropic dry over-etching.

In this method, the height of the side walls can be adjusted by dry etching which is superior in the control of an etching amount, and hence, the production procedure can be more stabilized.

The second production method for a semiconductor device of this invention comprises a first step of forming an isolation in an area close to a surface of a semiconductor substrate so as to surround an active area; a second step of forming a gate insulating film in the active area on the semiconductor substrate; a third step of depositing a plate-like polysilicon film on the gate insulating film and the isolation; a fourth step of forming a line-like polysilicon film at least in the active area by selectively removing the plate-like polysilicon film by etching; a fifth step of depositing an insulating film for a side wall on the semiconductor substrate, the isolation and the line-like polysilicon film, into a shape in accordance with surface shapes of the semiconductor substrate, the isolation and the line-like polysilicon film; a sixth step of depositing, on the insulating film for a side wall, a masking film made of a material having high etch selectivity against the insulating film for a side wall, and then etching back the masking film so as to allow the masking film to remain merely at corners of the insulating film for a side wall; a seventh step of conducting etching by using the masking film remaining at the corners of the insulating film for a side wall as a mask, so as to form L-shaped side walls having a height smaller than a height of the line-like polysilicon film on both sides of the line-like polysilicon film; an eighth step of forming a source/drain region on the both sides of the line-like polysilicon film in the active area by introducing impurity into the semiconductor substrate; a ninth step of removing the masking film and then depositing a metal film on the entire surface of the semiconductor substrate in which a top surface of the line-like polysilicon film and portions of side surfaces of the line-like polysilicon film projecting from the side walls are exposed; a tenth step of forming a silicide layer in contact with the top surface and the portions of the side surfaces of the line-like polysilicon film by allowing the metal film to react with the exposed portions of the line-like polysilicon film through a high temperature annealing treatment; and an eleventh step of removing an unreacted portion of the metal film.

By this method, the second semiconductor device can be produced with ease.

Also in the second production method, the aforementioned preferred embodiments of the first production method can be adopted.

DETAILED DESCRIPTION OF THE INVENTION (Embodiment 1)

A semiconductor device according to a first embodiment will now be described referring to FIGS. 1 and 2(a) through 2(f).

Figure 1:
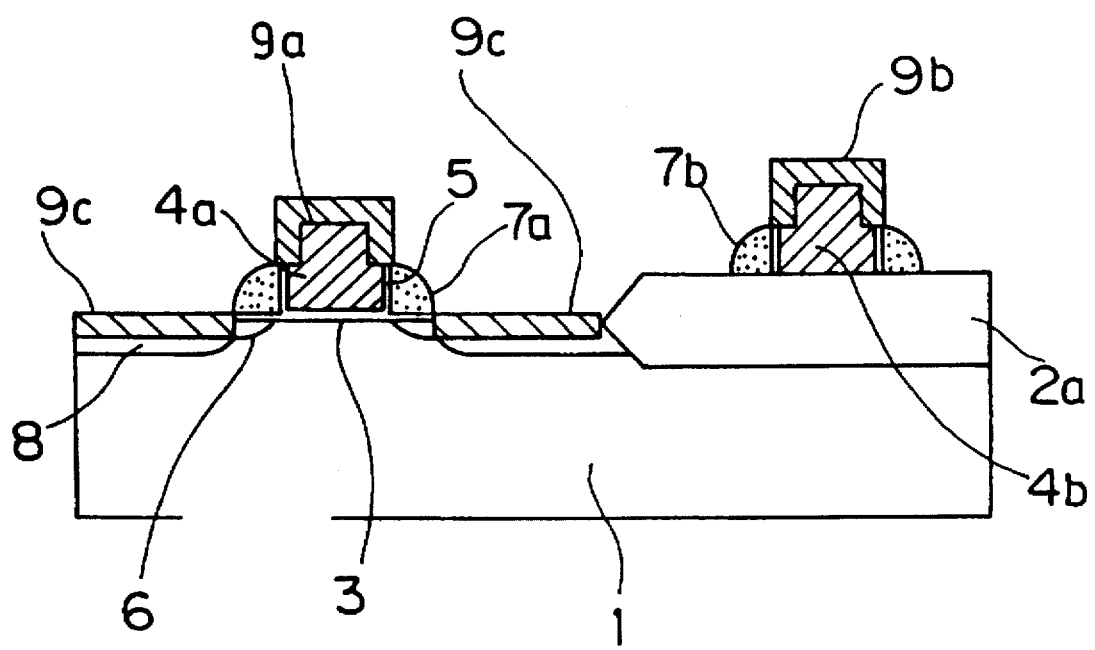
FIG. 1 is a sectional view of a semiconductor device according to a first embodiment of the invention.

FIG. 1 shows the sectional structure of the semiconductor device of Embodiment 1. Respective elements in FIG. 1 are referred to by using the following reference numerals: A reference numeral 1 denotes a silicon substrate. A reference numeral 2a denotes an isolation for partitioning each active area, and the isolation 2a consists of a silicon oxide film with a thickness of 350 nm formed by an LOCOS an isolation method. A reference numeral 3 denotes a gate oxide film, which consists of a silicon oxide film with a thickness of 9 nm. A reference numeral 4a denotes a polysilicon electrode formed by doping a line-like polysilicon film having a minimum line-width of 0.35 μm (350 nm) and a thickness of 330 nm by ion injection. A reference numeral 4b denotes a polysilicon wire formed on the isolation 2a, which consists of the same material with the same width and the same thickness as the polysilicon film constituting the polysilicon electrode 4a, whereas part of the polysilicon wire 4b can be positioned on the semiconductor substrate 1. A reference numeral 5 denotes a protection oxide film for protecting the polysilicon electrode 4a and the like, which consists of a silicon film with a thickness of approximately 10 nm. A reference numeral 6 denotes a low concentration source/drain region formed by injecting impurity ions at a low concentration into the active area of the silicon substrate 1. A reference numeral 7a denotes electrode side walls formed on the both sides of the polysilicon electrode 4a, and a reference numeral 7b denotes wire side walls formed on the both sides of the polysilicon wire 4b. The side walls 7a and 7b are formed out of silicon nitride films simultaneously deposited, and have the same width of 70 nm and the same height of 200 nm. Therefore, the height of the side walls 7a and 7b is smaller by 130 nm than the thickness of the polysilicon electrode 4a and the polysilicon wire 4b, i.e., 330 nm. In other words, portions of the side surfaces of the polysilicon electrode 4a and the polysilicon wire 4b projecting from the side walls 7a and 7b have a length of 130 nm. A reference numeral 8 denotes a high concentration source/drain region formed by injecting the impurity ions into the active area of the silicon substrate 1 at a high concentration. The source/drain region 8 is positioned on one side of the low concentration source/drain region 6 with the polysilicon electrode 4a on the other side thereof.

As one of the characteristics of this embodiment, an electrode silicide layer 9a made of TiSi$_2$, a reaction product of titanium and silicon, is formed on the top surface of the polysilicon electrode 4a and on the portions of the side surfaces thereof projecting from the electrode side walls 7a. The polysilicon electrode 4a and the electrode silicide layer 9a together form a gate electrode. Similarly, a wire silicide layer 9b made of TiSi$_2$ is formed on the top surface of the polysilicon wire 4b and on the portions of the side surfaces thereof projecting from the wire side walls 7b. The polysilicon wire 4b and the wire silicide layer 9b together form a gate wire. Furthermore, a substrate silicide layer 9c made of TiSi$_2$ is formed in contact with the high concentration source/drain region 8. In this embodiment, the respective silicide layers 9a through 9c are formed out of TiSi$_2$ films with a thickness of approximately 120 nm.

Figures 23A, 23B, 23C, 23D, 23E, 23F:
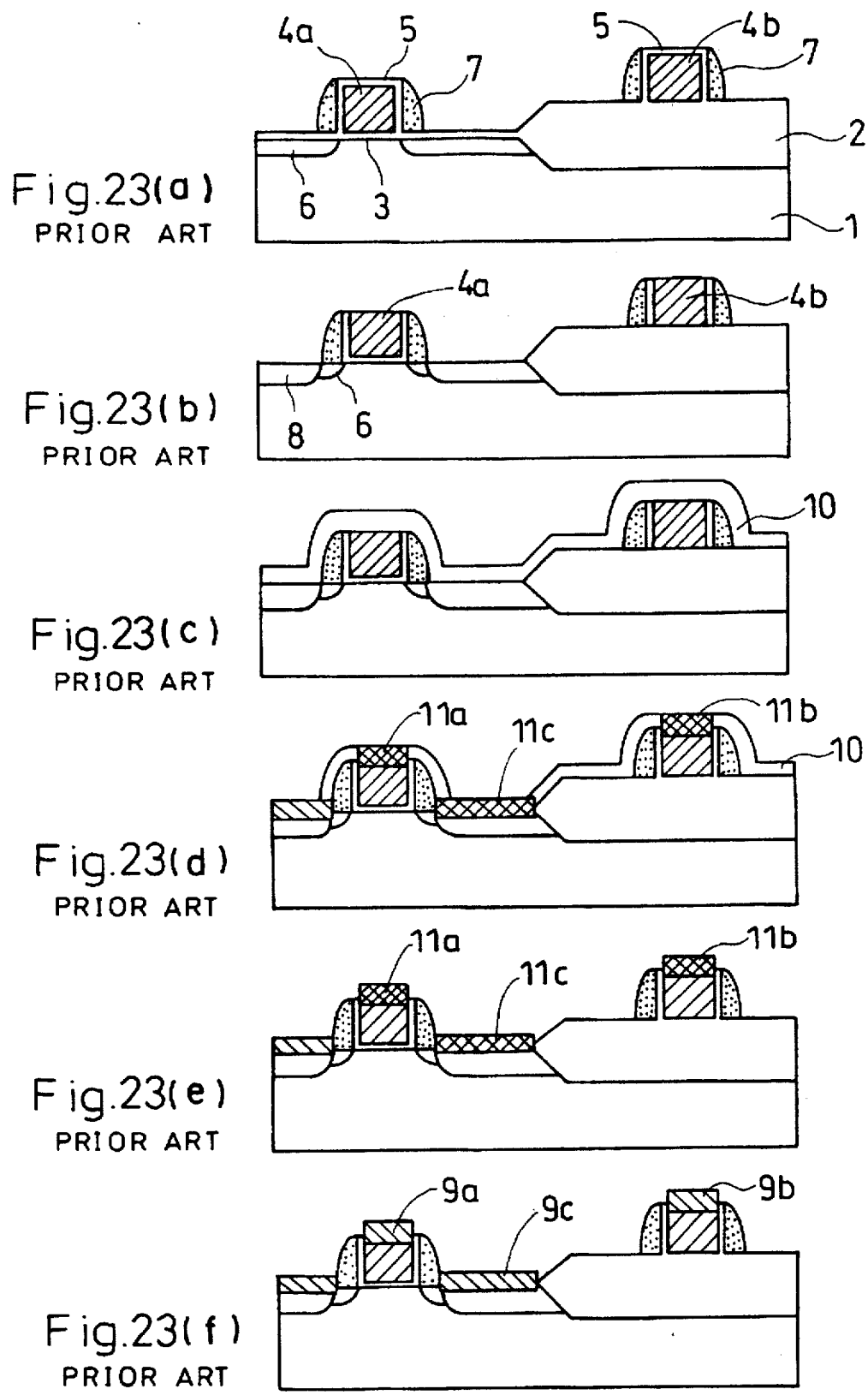
FIGS. 23(a) through 23(f) are sectional views for showing the production procedure for the semiconductor device of FIG. 22.

In the present semiconductor device having the aforementioned structure, the silicide layers 9a and 9b are formed so as to be in contact with the top surfaces and part of the side surfaces (corresponding to a portion with a length of ⅓ or more of the thickness of the polysilicon film in its section) of the polysilicon electrode 4a and the polysilicon wire 4b of the MOS transistor. In contrast, in the semiconductor device having the conventional salicide structure as shown in FIG. 23, the silicide layers 9a and 9b are formed so as to be in contact with merely the top surfaces of the polysilicon electrode 4a and the polysilicon wire 4b of the MOS transistor. Therefore, since the silicide layers 9a and 9b are formed also on the side surfaces of the polysilicon electrode 4a and the polysilicon wire 4b in the structure of this embodiment, the resistance values of the gate electrode and the gate wire can be further reduced. Specifically, although the width of the conventional silicide layers 9a and 9b is identical to the width of the polysilicon film, the width of the present silicide layers 9a and 9b is a sum of the width of the polysilicon film, i.e., 350 nm, and the lengths of the portions on the both side surfaces thereof, i.e., 260 nm (130 nm+130 nm), that is, 610 nm. Thus, the area of the present silicide layer 9a and 9b is 1.85 times as large as that of the conventional silicide layers, and hence, the resistance value of the gate electrode and the gate wire can be reduced to be 0.54 times as high as that of the conventional one.

In this embodiment, the silicidated portion of the side surface of the polysilicon film constituting the polysilicon electrode 4a and the polysilicon wire 4b has a length of 130 nm. It is noted, however, that the invention is not limited to this length. The larger the thickness of the polysilicon film becomes, or the smaller the height of the side walls 7a and 7b becomes, the larger the area of the silicidated portion of the polysilicon film becomes. This results in further decrease of the resistance value of the gate electrode and the gate wire, allowing the effect to be remarkably exhibited.

Furthermore, although the silicide layers consist of the $TiSi_2$ films in this embodiment, the $TiSi_2$ film can be replaced with a $CoSi_2$ film, a NiSi film, a WSi film, a $PtSi_2$ film or the like.

In addition, although the side walls 7a and 7b are formed out of silicon nitride films in this embodiment, the silicon nitride film can be replaced with a $SiO_2$ film or another insulating film. The composition of the silicon nitride film is not limited to $Si3N_4$, which is used in this embodiment, but can be any composition satisfying a general formula of $Si_xN_y$.

Also, the width and the thickness of the polysilicon film constituting the polysilicon electrode 4a and the polysilicon wire 4b, the width and the height of the side walls 7a and 7b, the thickness of the $TiSi_2$ films constituting the silicide layers 9a through 9c and the like are not limited to those values mentioned herein.

It is also noted that the protection oxide film 5 is not always necessary between the side walls 7a and 7b, and the polysilicon electrode 4a, the polysilicon wire 4b and the silicon substrate 1. When the side walls are formed out of the silicon nitride film as in this embodiment, the protection oxide film is preferably interposed below the side walls in view of improving adhesion with the polysilicon film and the silicon substrate below.

Now, the production method for the semiconductor device of FIG. 1 will be described referring to FIGS. 2(a) through (f).

Figure 2:
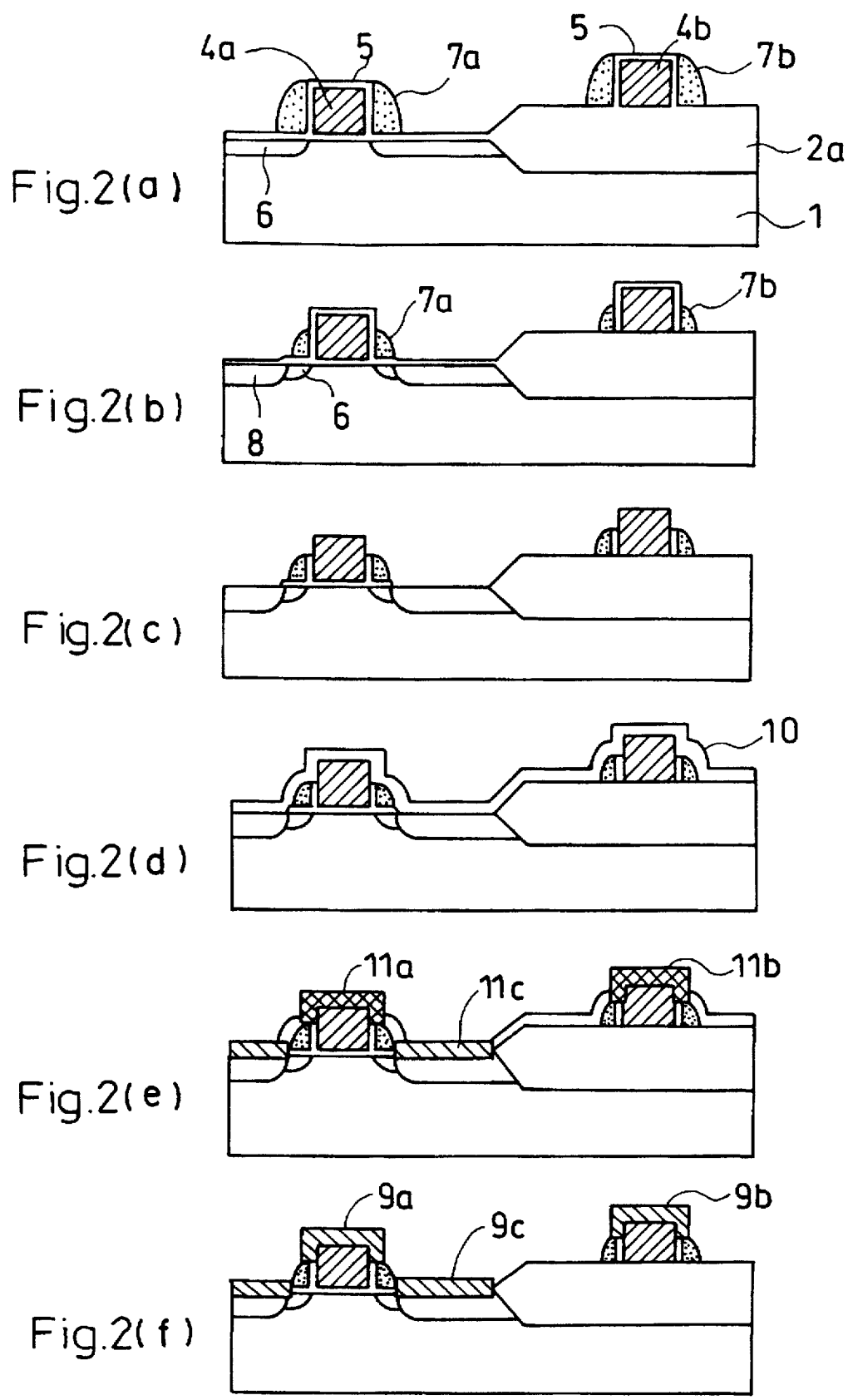
FIGS. 2(a) through 2(f) are sectional views for showing the production procedure for the semiconductor device of FIG. 1.

First, as is shown in FIG. 2(a), the isolation 2a is formed around the surface of the silicon substrate 1 for surrounding the active area. The gate oxide film 3 is formed in the active area on the silicon substrate 1, and then, the polysilicon film is deposited on the entire surface of the resultant substrate 1. The substrate 1 is then subjected to etching using a photo-resist mask (not shown) so as to selectively remove the polysilicon film, thereby simultaneously patterning the polysilicon electrode 4a within the active area and the polysilicon wire 4b on the isolation 2a. Then, the protection oxide film 5 is formed on the entire surface of the resultant substrate 1.

In this embodiment, the LOCOS an isolation method is adopted to form the isolation 2a, which is made of a silicon oxide film with a thickness of 350 nm. The thickness of the gate oxide film 3 is 9 nm. In the formation of the polysilicon electrode 4a and the polysilicon wire 4b, the polysilicon film with a thickness of 330 nm is deposited and patterned into a thin wire with a minimum line-width of 0.35 µm. Furthermore, by using the polysilicon electrode 4a and the protection oxide film 5 as masks, impurity ions are injected into the active area of the silicon substrate 1 at a low concentration, thereby forming the low concentration source/drain region 6. After this, a thick silicon nitride film deposited by the chemical vapor deposition (CVD) is subjected to anisotropic etching, thereby forming the electrode side walls 7a and the wire side walls 7b on the both sides of the polysilicon electrode 4a and the polysilicon wire 4b, respectively. In the formation of these side walls 7a and 7b, the silicon nitride film with a thickness of 200 nm is deposited and then subjected to the anisotropic etching, so that the resultant side walls 7a and 7b have a width of 200 nm and a thickness of 330 nm.

Next, as is shown in FIG. 2(b), the height of the side walls 7a and 7b is reduced by wet etching or dry etching. After forming the high concentration source/drain region 8 by injecting the impurity ions at a high concentration, an annealing treatment is conducted for activating the injected impurity.

In the step shown in FIG. 2(b), the wet etching using heated phosphoric acid ($H_3PO_4$) is adopted in this embodiment to reduce the height of the side walls 7a and 7b. Since the side walls 7a and 7b are formed out of the silicon nitride film, the etch selectivity against $SiO_2$ constituting the protection oxide film 5 and the isolation 2a and polysilicon can be large. For example, when a heated solution of phosphoric acid ($H_3PO_4$) at a temperature of 150° C. whose concentration is controlled is used for the wet etching, the etching rate of the silicon nitride film is 35A/min. and the selectivity is 30 or more. Thus, isotropic etching can be conducted, and substantially without removing the isolation, the dimension of the side walls 7a and 7b of the silicon nitride film can be decreased from the width of 200 nm and the height of 330 nm to a width of 70 nm and a height of 200 nm. The wet etching time at this point is approximately 40 min. In adopting the dry etching, when the selectivity between the silicon nitride film and polysilicon or the oxide film is large, the dimension of the side walls 7a and 7b shown in FIG. 2(b) can be attained by performing over-etching in the formation of the side walls in the step shown in FIG. 2(a).

Since the side walls 7a and 7b are formed out of the silicon nitride film and subjected to the wet etching using heated phosphoric acid in this embodiment, the isolation 2a is prevented from being etched at this point. Thus, problems such as an isolation leakage due to the decrease of the thickness of the isolation 2a can be avoided, and the transistor can be advantageously stably produced.

Then, as is shown in FIG. 2(c), the protection oxide film 5 remaining on the polysilicon electrode 4a, the polysilicon wire 4b and the high concentration source/drain region 8 is removed by wet etching, thereby exposing the surfaces of the polysilicon electrode 4a, the polysilicon wire 4b and the silicon substrate 1. At this point, a solution having an etching speed ratio of $NH_4F$ to HF of 20:1 is used and the wet etching is performed for 20 sec. in this embodiment.

Next, as is shown in FIG. 2(d), a titanium film 10 is deposited by the sputtering method on the entire surface of the substrate 1. The titanium film 10 has a thickness of 50 nm.

Then, as is shown in FIG. 2(e), the RTA (rapid thermal annealing) treatment is conducted at a temperature of 650° C., which allows silicon in the polysilicon electrode 4a, the polysilicon wire 4b and the high concentration source/drain region 8 to react with titanium, thereby forming silicide layers 11a through 11c out of a TiSi$_2$ film. At this point, the top surface and part of side surfaces of the polysilicon electrode 4a and the polysilicon wire 4b are silicidated. The titanium film 10 on the isolation 2a and the side walls 7a and 7b is not silicidated owing to the absence of silicon therebelow but remains to be unreacted titanium.

Then, as is shown in FIG. 2(f), wet etching is performed to selectively remove the titanium film 10 of the unreacted titanium remaining on the isolation 2a and the side walls 7a and 7b, while maintaining the silicide layers 11a through 11c. In this embodiment, an aqueous mixture of ammonia and hydrogen peroxide is used as a selective wet etching solution. Furthermore, since the TiSi$_2$ film (C49) constituting the silicide layers 11a through 11c has rather high resistivity because it is formed by the annealing treatment at a comparatively low temperature (650° C.), a second RTA treatment is conducted at a comparatively high temperature (825° C.), thereby forming the electrode silicide layer 9a, the wire silicide layer 9b and the substrate silicide layer 9c made of a TiSi$_2$ film (C54) having low resistivity. Although the sectional view of the substrate in the procedure thereafter is not herein shown, an interlayer insulating film is deposited and flattened, a contact hall is formed, a metal wire film is deposited and a metal wire is formed, so as to complete an LSI.

In this manner, the semiconductor device mounting the MOS transistor having the salicide structure as shown in FIG. 1 can be produced.

(Embodiment 2)

The structure of a semiconductor device according to Embodiment 2 will be described referring to FIG. 3.

Figure 3:
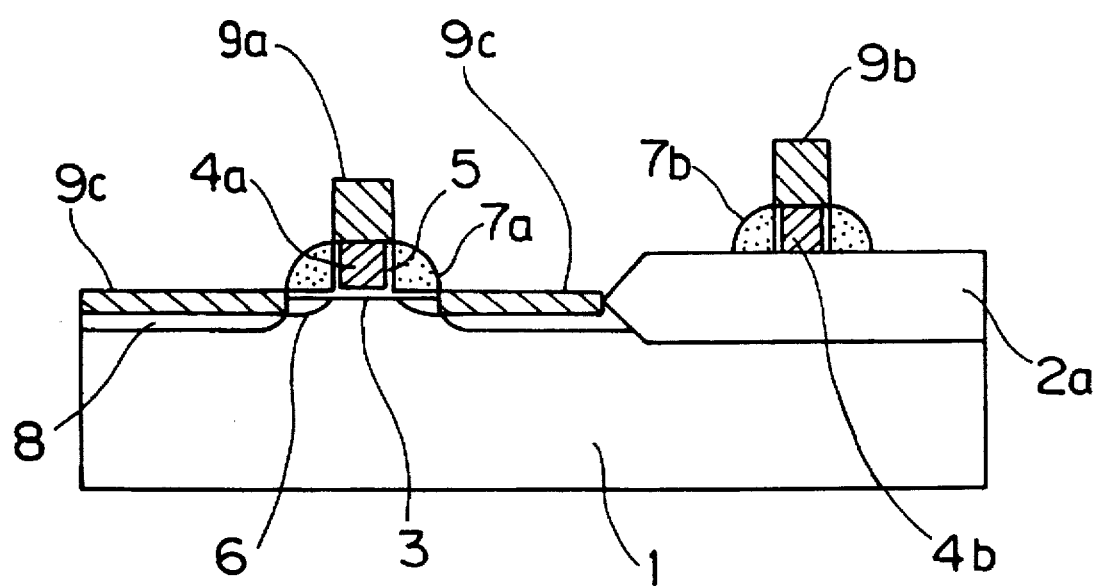
FIG. 3 is a sectional view of a semiconductor device according to a second embodiment of the invention.

In FIG. 3, like reference numerals are used to refer to like elements used in FIG. 1 and the description is herein omitted. As is understood from FIG. 3, the structure of the semiconductor device of this embodiment is substantially the same as that of the semiconductor device of Embodiment 1 shown in FIG. 1. In this embodiment, however, since the width of the polysilicon electrode 4a and the polysilicon wire 4b is very minimized, the silicide layers 9a and 9b respectively formed on the both sides of the polysilicon electrode 4a and the polysilicon wire 4b are in contact with each other at the center of the polysilicon film. In other words, this embodiment is characterized in that the polysilicon film projecting from the side walls 7a and 7b is all silicidated. In this case, the minimum line-width of the polysilicon film constituting the polysilicon electrode 4a and the polysilicon wire 4b is smaller than twice of the depth of the silicidated portion of the polysilicon film. For example, when the depth of the silicidated portion of the polysilicon film is 120 nm, the width of the polysilicon film is 240 nm or less. Under this condition, the respective side portions of the polysilicon film to be successively silicidated come in contact with each other before the upper portion of the polysilicon film to be silicidated reaches a point at the same height as the upper ends of the side walls 7a and 7b. This embodiment can be advantageously applied to a superrefined LSI that will be used in the future.

The production procedure for producing the present semiconductor device is substantially the same as that shown in FIGS. 2(a) through 2(b) described in Embodiment 1, and hence, it is herein neither shown nor described.

(Embodiment 3)

Figure 4:
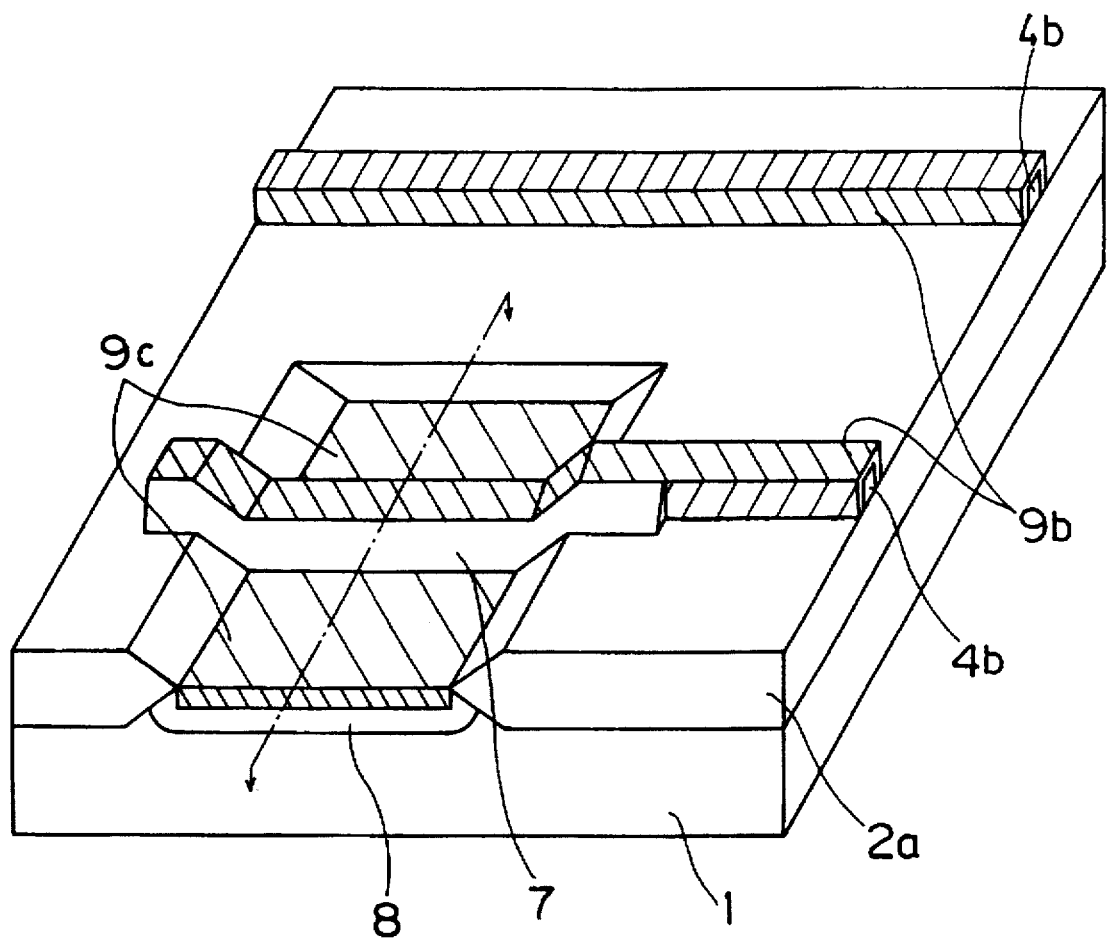
FIG. 4 is a perspective view of a semiconductor device according to a third embodiment of the invention.
Figure 5:
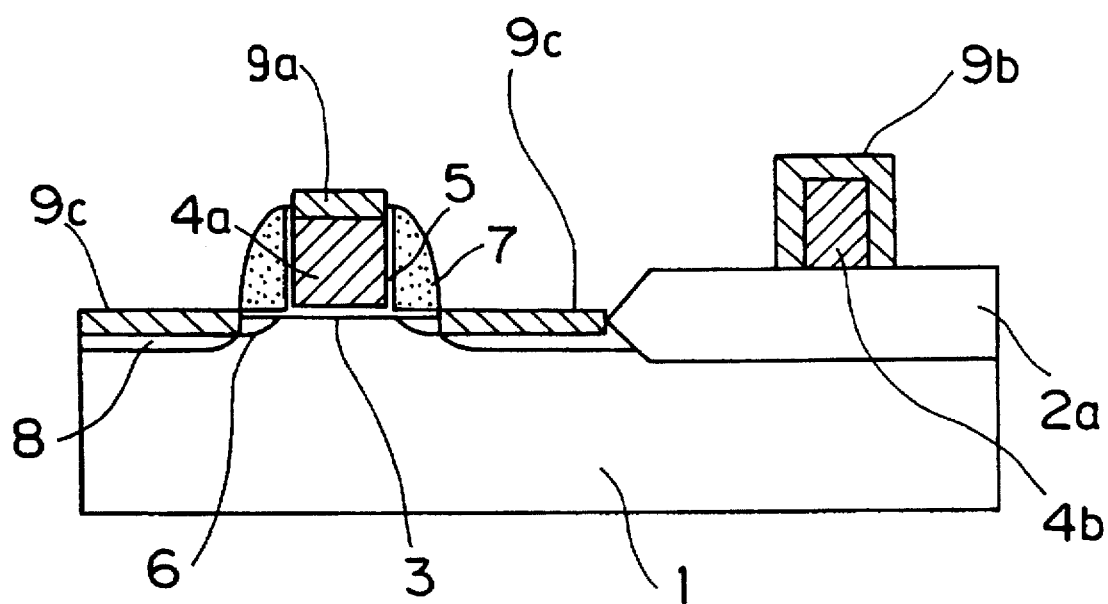
FIG. 5 is a sectional view of the semiconductor device of FIG. 4 taken on line V—V.

The structure of a semiconductor device of Embodiment 3 will now described referring to FIGS. 4, 5 and 6(a) through 6(f). FIG. 4 is a perspective view of the semiconductor device of this embodiment in one step of the production procedure, and FIG. 5 is a sectional view thereof taken on line V—V of FIG. 4. In FIGS. 4 and 5, like reference numerals are used to refer to like elements used in Embodiment 1 shown in FIG. 1 and the description is omitted. As is understood from FIG. 5, the structure of this semiconductor device is substantially the same as that of the semiconductor device of Embodiment 1 shown in FIG. 1. In this embodiment, however, unlike Embodiment 1, the height of the side walls 7 on the both sides of the polysilicon electrode 4a is substantially the same as the thickness of the polysilicon film, and the electrode silicide layer 9a is formed merely on the top surface of the polysilicon electrode 4a. Furthermore, the polysilicon wire 4b excluding a portion close to the polysilicon electrode 4a has no side wall, and the wire silicide layer 9b is formed on the upper and both side surfaces of the polysilicon wire 4b. The substrate silicide layer 9c has the same structure as the substrate silicide layer 9c of Embodiment 1.

According to the structure of the semiconductor device of this embodiment, the polysilicon electrode 4a formed in the active area of a transistor in a general MOS LSI occupies a smaller area in the entire polysilicon film as compared with the polysilicon wire 4b formed on the isolation 2a. This is because the polysilicon wire 4b on the isolation 2a is used for interconnecting transistors and the like. Therefore, even the decrease of the resistance value of merely the polysilicon wire 4b on the isolation 2a can exhibit a great effect, making a large contribution to a high speed operation and a high density of the MOS LSI. In this embodiment, when the polysilicon film has a minimum line-width of 0.35 μm (350 nm) and a thickness of 330 nm as in Embodiment 1, the total length of the wire silicide layer 9a in the sectional view of FIG. 4 is a sum of the width of the polysilicon wire 4b, that is, 350 nm, and the height of the both sides of the polysilicon wire 4b, that is, 330 nm+330 nm, which is 1010 nm. Therefore, the silicidated portion has an area approximately 2.9 times as large as that in a conventional device. As a result, the resistance value can be reduced to be 0.34 times in accordance with simple calculation. Thus, this embodiment has a remarkable effect particularly in reducing the resistance value.

Now, the production procedure for the present semiconductor device will be described referring to FIGS. 6(a) through 6(f).

Figure 6:
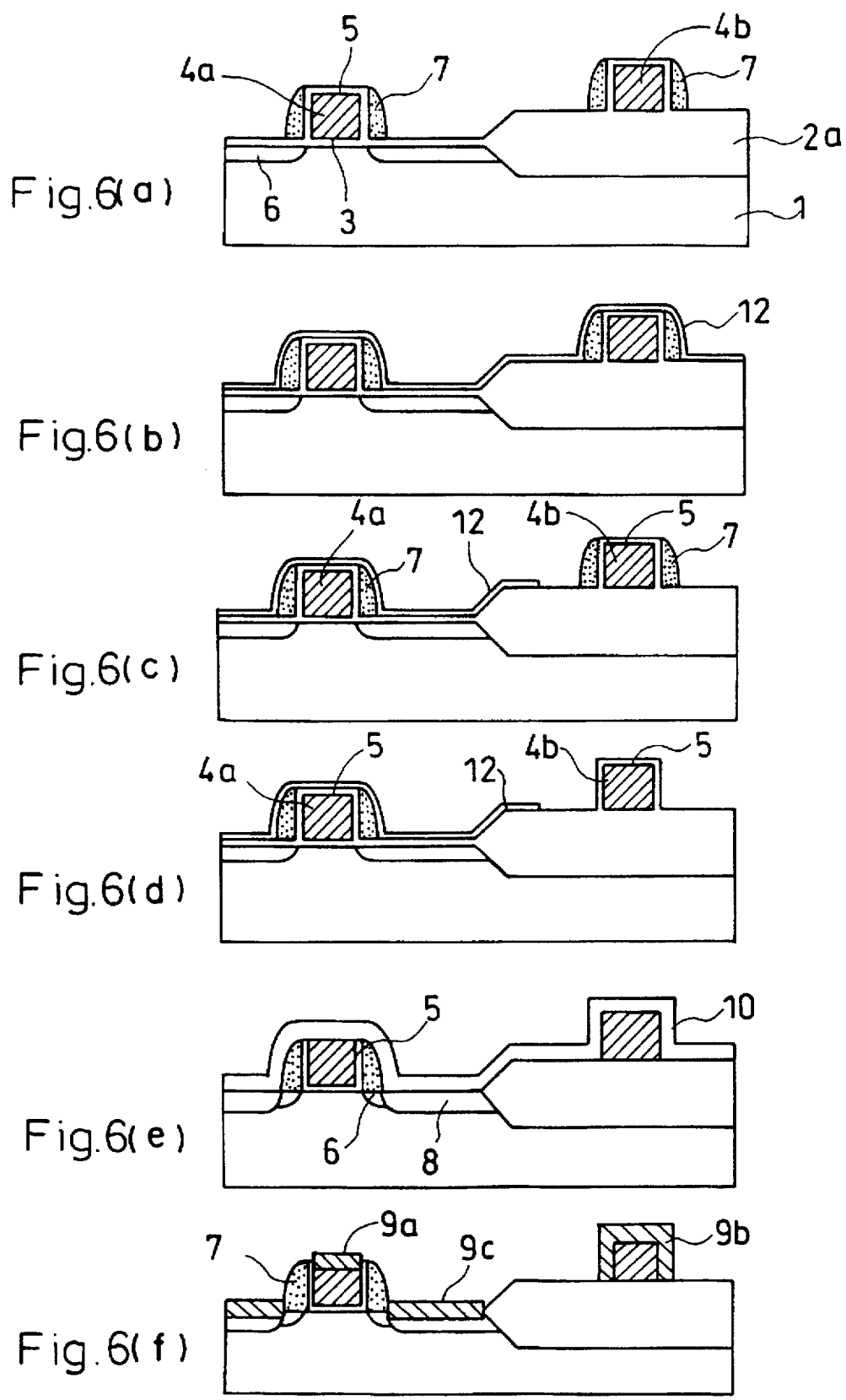
FIGS. 6(a) through 6(f) are sectional views for showing the production procedure for the semiconductor device of FIG. 4.

First, as is shown in FIG. 6(a), the same step as described referring to FIG. 2(a) of Embodiment 1 is conducted. In this embodiment, however, the silicon nitride film constituting the side wall 7 has a thickness of 100 nm.

Then, as is shown in FIG. 6(b), an oxide film 12 for etching with a thickness of 20 nm is deposited on the entire surface of the substrate 1 by the CVD.

Next, as is shown in FIG. 6(c), part of the oxide film 12 for etching formed on the isolation 2a is selectively removed excluding a portion on and near the active area by using a solution having an etching speed ratio between NH$_4$F and HF of 20:1. At this point, the oxide film 12 for etching is etched after forming a photoresist mask (not shown) having openings corresponding to areas to be removed.

Next, as is shown in FIG. 6(d), wet etching using heated phosphoric acid at a temperature of 150° C. is conducted, thereby removing the side walls 7 on the both sides of the polysilicon wire 4b on the isolation 2a, while maintaining the side walls 7 on the both sides of the polysilicon electrode 4a in the active area. It is noted that part of the side walls 7 on the both sides of the polysilicon wire 4b close to the active area remains as is shown in FIG. 5, although this is not shown in FIG. 6(d).

Then, as is shown in FIG. 6(e), the remaining portions of the oxide film 12 for etching is removed by using a solution having an etching speed ratio between $NH_4F$ and HF of 20:1. Then, by using the polysilicon electrode 4a in the active area and the side walls 7 as masks, impurity ions are injected at a high concentration, thereby forming the high concentration source/drain region 8. Then, an annealing treatment is conducted to activate the injected impurity. Portions of the protection oxide film 5 which are exposed in the active area of the silicon substrate 1 and are positioned around the polysilicon film without being covered with the side walls 7 are removed by wet etching. After this, a titanium film 10 with a thickness of 50 nm is deposited on the entire surface of the resultant substrate 1.

Furthermore, as is shown in FIG. 6(f), a first RTA treatment is conducted to cause a reaction between titanium and silicon in portions where the polysilicon film is in contact with the titanium film 10 and the silicon substrate 1 is in contact with the titanium film 10, thereby forming the silicide layers made of the $TiSi_2$ film. The unreacted portions of the titanium film 10 is then removed, and a second RTA treatment is conducted, thereby forming the silicide layers 9a through 9c having low resistivity. After this, an interlayer insulating film is deposited and flattened, a contact hall is formed, a metal wire film is deposited and a metal wire is formed, so as to complete an LSI.

In this manner, the semiconductor device mounting the MOS transistor having the salicide structure as shown in FIGS. 4 and 5 can be produced.

In the aforementioned procedure of this embodiment, in order to provide the side wall to the sides of the polysilicon electrode 4a alone, the oxide film 12 for etching is formed and the wire side walls 7b is removed, after forming the electrode side walls 7a and the wire side walls 7b. However, it is possible to form such electrode side walls by, for example, depositing an insulating film for forming the side wall merely in the active area of the substrate and conducting anisotropic etching of the insulating film.

(Embodiment 4)

Figure 7:
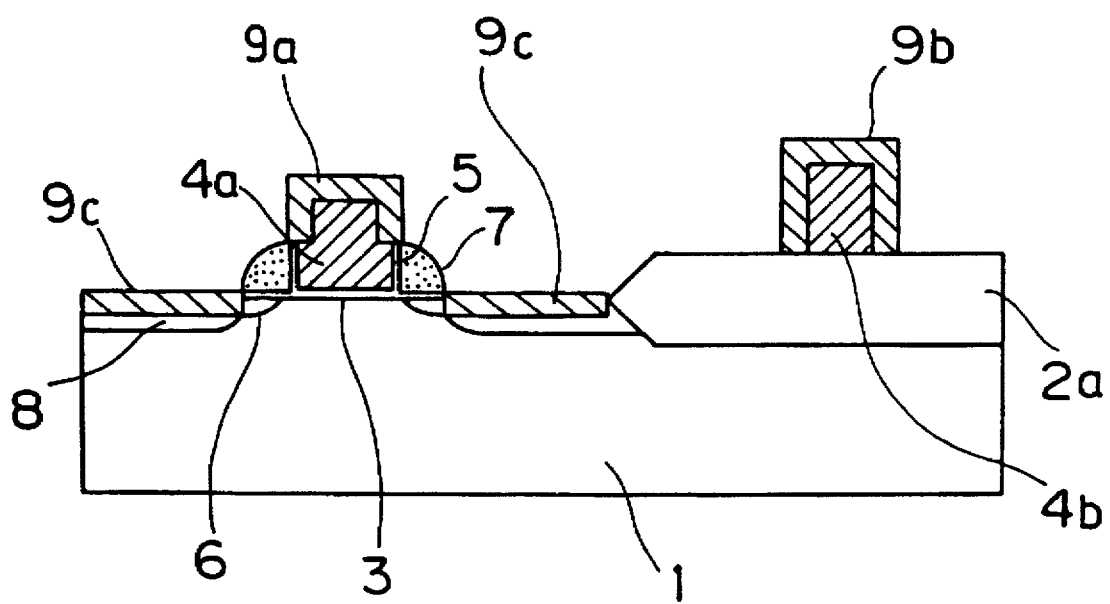
FIG. 7 is a sectional view of a semiconductor device according to a fourth embodiment of the invention.

A semiconductor device of a fourth embodiment will now be described referring to FIG. 7, which is a sectional view showing the structure of the semiconductor device of this embodiment. As is shown in FIG. 7, the structure of the present semiconductor device is substantially the same as that of the semiconductor device of Embodiment 3 shown in FIG. 4. In this embodiment, however, unlike Embodiment 3 but similarly to Embodiment 1, the electrode silicide layer 9a is formed on the top surface and part of the side surfaces of the polysilicon electrode 4a. In other words, the electrode silicide layer 9a covers portions of the side surfaces of the polysilicon electrode 4a projecting from the side walls 7.

Accordingly, this embodiment can achieve not only the effect to largely decrease the resistance value owing to the wire silicide layer 9b formed around the polysilicon wire 4b similarly to Embodiment 3 but also an effect to reduce the resistance value owing to the electrode silicide layer 9a.

(Embodiment 5)

A semiconductor device of a fifth embodiment will now be described referring to FIGS. 8, 9, 10(a) through 10(f) and 11.

Figure 8:
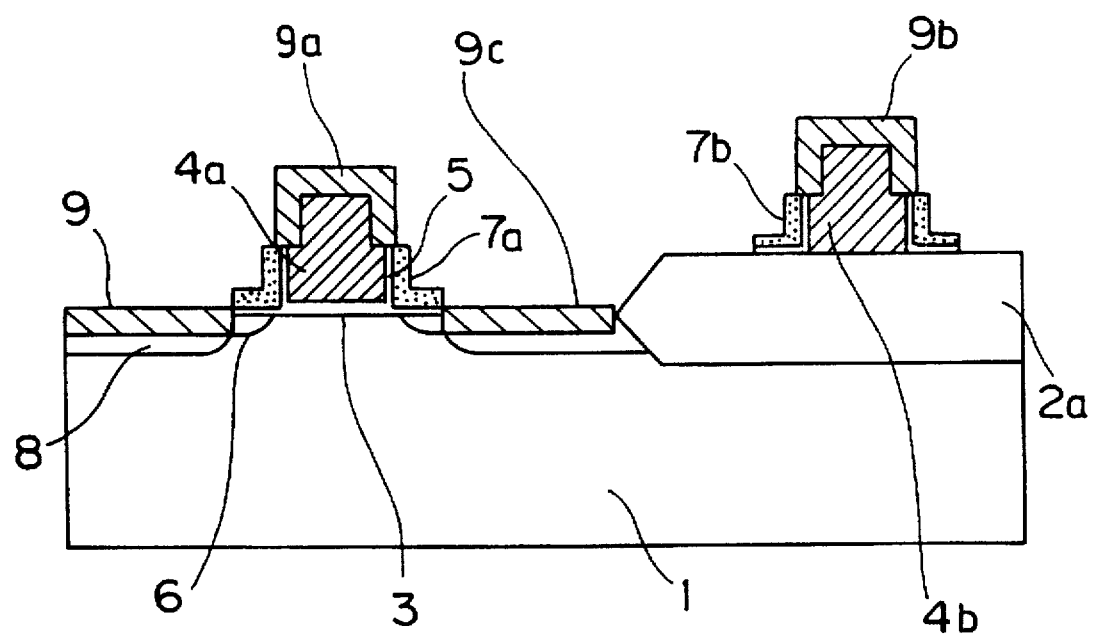
FIG. 8 is a sectional view of a semiconductor device according to a fifth embodiment of the invention.
Figure 9:
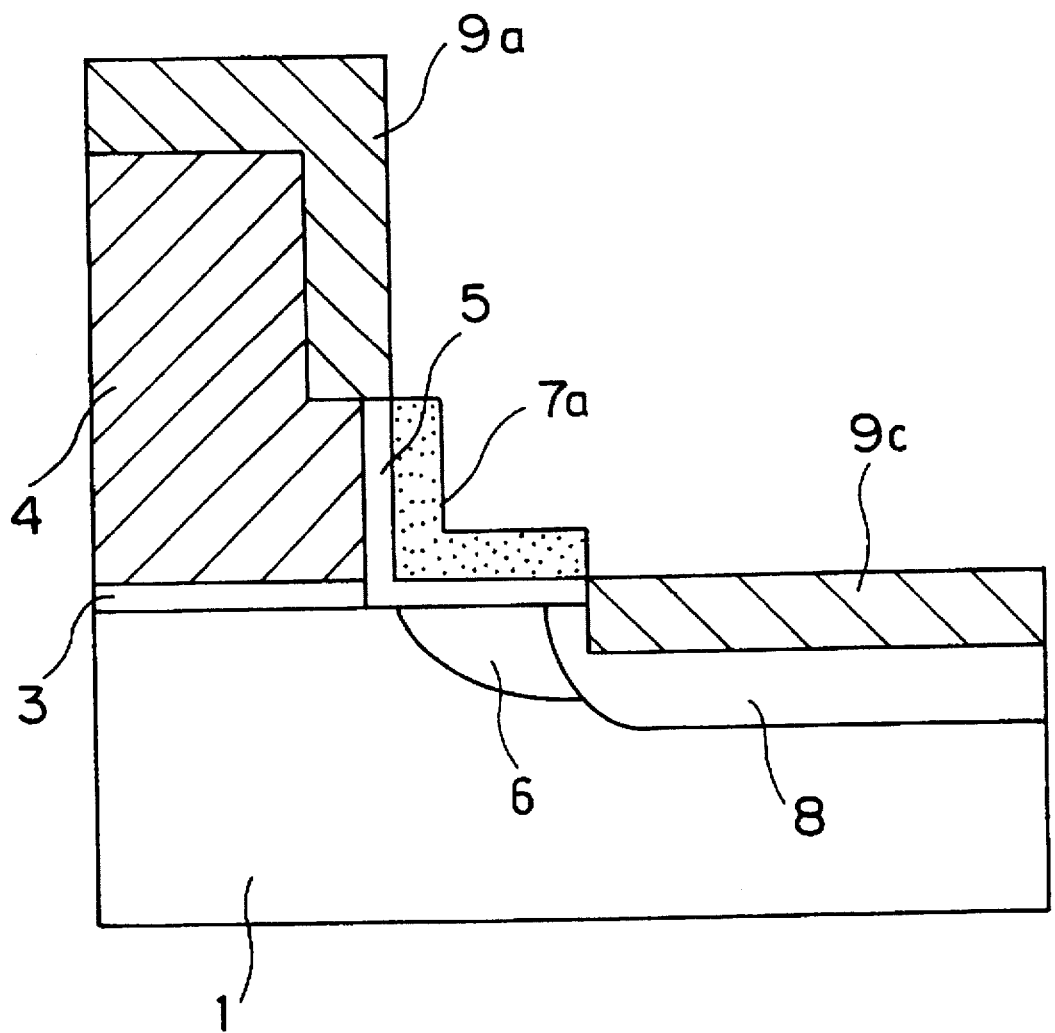
FIG. 9 is a partly enlarged sectional view of the semiconductor device of FIG. 8.

FIG. 8 is a sectional view showing the structure of the semiconductor device of this embodiment, and FIG. 9 is a partly enlarged sectional view thereof. In these FIGS., like reference numerals are used to refer to like elements used in Embodiment 1 shown in FIG. 1, and the description is omitted. As is shown in FIG. 8, the structure of this semiconductor device is substantially the same as that of the semiconductor device of Embodiment 1 shown in FIG. 1. In this embodiment, however, unlike Embodiment 1, the polysilicon electrode 4a and the polysilicon wire 4b are provided with L-shaped electrode side walls 7a and L-shaped wire side walls 7b, respectively on the both sides thereof with the protection oxide film 5 sandwiched therebetween. The electrode silicide layer 9a, the wire silicide layer 9b and the substrate silicide layer 9c have basically the same structures as those of Embodiment 1 shown in FIG. 1.

The present embodiment is advantageous in that the L-shaped side walls 7a and 7b with a height smaller than the thickness of the polysilicon film constituting the polysilicon electrode 4a and the polysilicon wire 4b can be formed without fail in the production procedure as described below. In addition, since it is easy to reduce the height of the electrode side walls 7a while keeping its width to some extent, it is advantageously possible to reduce the resistance value while maintaining a rapid operation and high voltage resistance of a MOS transistor having an LDD structure.

Now, the production procedure for the semiconductor device having the structure as shown in FIGS. 8 and 9 will be described referring to FIGS. 10(a) through 10(f) and 11. FIGS. 10(a) through 10(f) are sectional views for showing the structural change of the present semiconductor device during the production procedure, and FIG. 11 is an enlarged sectional view of part of the semiconductor device in a step shown in FIG. 10(c).

Figure 10:
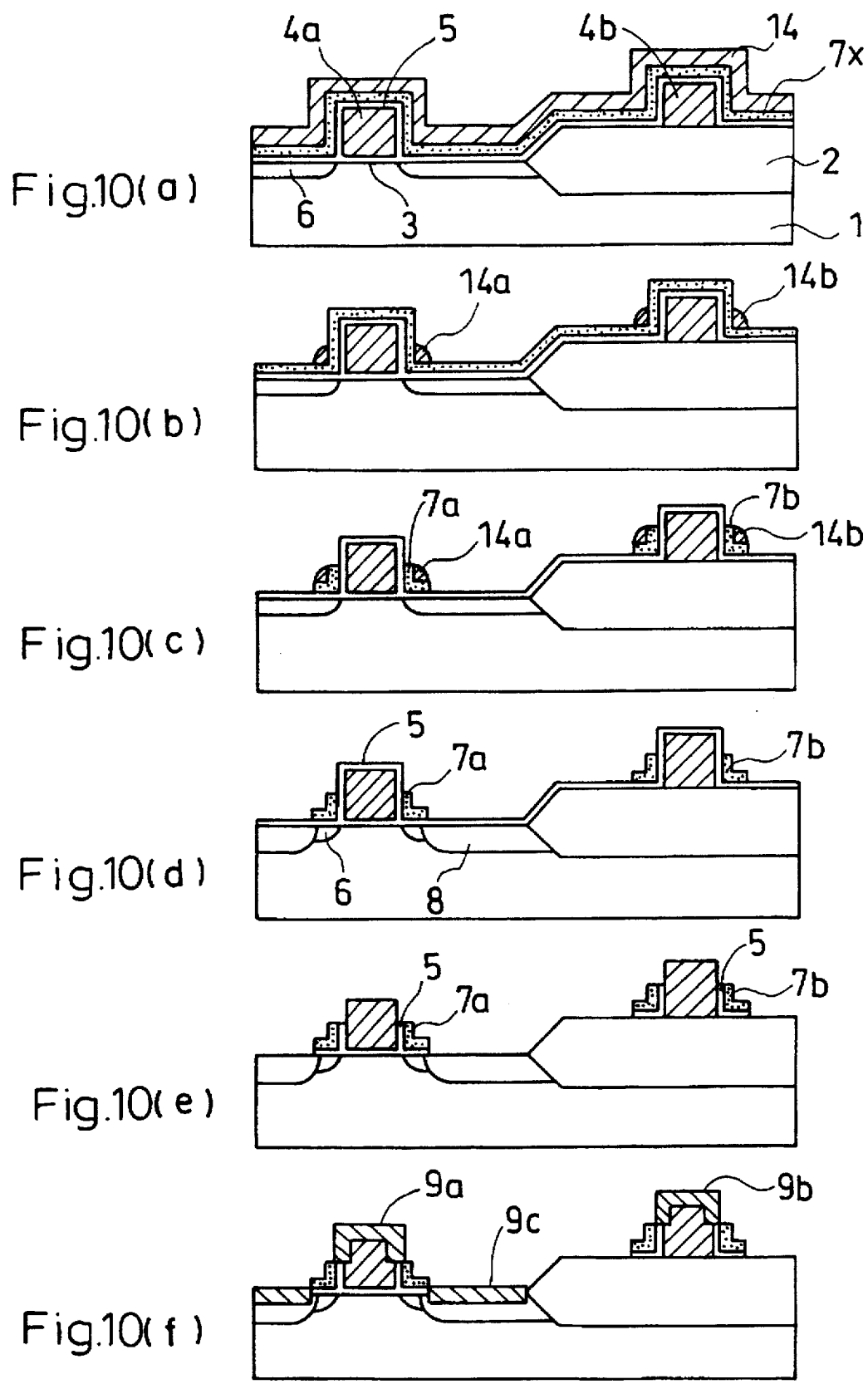
FIGS. 10(a) through 10(f) are sectional views for showing the production procedure for the semiconductor device of FIG. 8.
Figure 11:
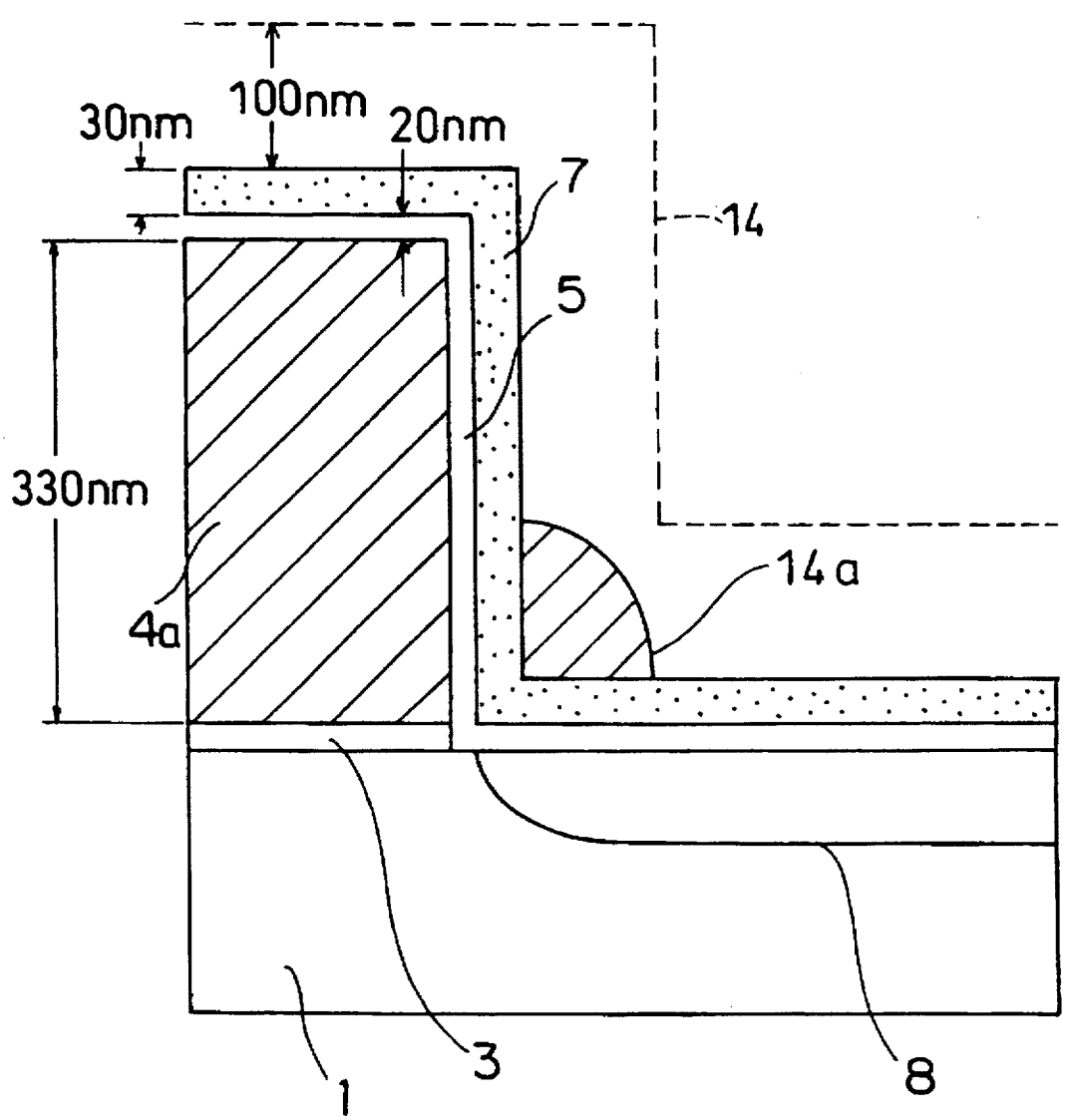
FIG. 11 is an enlarged sectional view of the semiconductor device of FIG. 8 in one step of the production procedure.

First, as is shown in FIG. 10(a), the polysilicon electrode 4a is formed on the gate oxide film 3 in the active area of the silicon substrate 1, and the polysilicon wire 4b is formed on the isolation 2a. The materials and the forming method for these elements are the same as those used in Embodiment 1. Then, the protection oxide film 5 is deposited on the entire surface of the resultant substrate, and by using the polysilicon electrode 4a and the protection oxide film 5 on both sides thereof as masks, impurity ions are injected at a low concentration, thereby forming the low concentration source/drain region 6. Furthermore, a silicon nitride film 7x to be used as a side wall and a polysilicon film 14 to be used as a mask are deposited on the protection oxide film 5 by the CVD method. At this point, as is shown in FIG. 11, the polysilicon film constituting the polysilicon electrode 4a and the polysilicon wire 4b has a thickness of 330 nm and a minimum line-width of 0.35 micron, the protection oxide film 5 has a thickness of 20 nm, the silicon nitride film 7x has a thickness of 30 nm, and the polysilicon film 14 has a thickness of 100 mm Next, as is shown in FIG. 10(b), over-etching is conducted on the polysilicon film 14 by the RIE, so as to remove most part thereof excluding portions at corners. In this manner, electrode polysilicon masks 14a and wire polysilicon masks 14b are formed at the corners close to the bottoms of the polysilicon electrode 4a and the polysilicon wire 4b, respectively. At this point, the etch selectivity between the polysilicon film 14 and the silicon nitride film 7x is large.

Then, as is shown in FIG. 10(c), by using the polysilicon masks 14a and 14b as masks, wet etching using $H_3PO_4$ (heated phosphoric acid at a temperature of 150° C.) is conducted so as to remove most portions of the silicon nitride film 7x excluding portions covered by the polysilicon masks 14a and 14b. At this point, the etch selectivity between the silicon nitride film 7x and the polysilicon masks 14a and 14b can be approximately 30:1. In this manner, the L-shaped electrode side walls 7a and the L-shaped wire side walls 7b can be formed on the both sides of the polysilicon electrode 4a and the polysilicon wire 4b, respectively. The height of the side walls 7a and 7b can be much smaller than the thickness of the polysilicon film constituting the polysilicon electrode 4a and the polysilicon wire 4b. This is because, in Embodiment 1, if etching is conducted for a long period of time to reduce the height of the side walls 7a and 7b, the thickness of the isolation 2a can be also decreased, so that the isolation function can be degraded, but in this embodiment, such degradation cannot be caused.

Next, as is shown in FIG. 10(d), by using the polysilicon electrode 4a, the wire polysilicon mask 14a and the electrode side walls 9a as masks, the impurity ions are injected into the active area of the silicon substrate 1 at a high concentration, thereby forming the high concentration source/drain region 8. After this, the polysilicon masks 14a and 14b are removed by dry etching or wet etching.

Then, as is shown in FIG. 10(e), the exposed portions of the protection oxide film 5 on the substrate are removed by using a HF type etching solution. Then, a titanium film is deposited, and a first RTA treatment is conducted, thereby forming a silicide layer of a TiSi$_2$ film through the reaction between titanium and silicon. The state at this point is not shown because it is shown in the production procedure of the aforementioned embodiments.

Then, as is shown in FIG. 10(f), after removing the titanium film, a second RTA treatment is conducted, thereby forming the silicide layers 9a through 9c having low resistivity. After this, an interlayer insulating film is deposited and flattened, a contact hall is formed, a metal wire film is deposited and a metal wire is formed, so as to complete an LSI.

In this manner, the semiconductor device mounting the MOS transistor having the salicide structure as shown in FIGS. 8 and 9 can be produced.

In the production method for the semiconductor device according to this embodiment, when the polysilicon masks 14a and 14b are formed through etch back of the polysilicon film 14, the lower portion of the polysilicon film 14 is covered with the protection oxide film 5. Therefore, the silicon substrate 1 and the isolation 2a therebelow would not be etched by even long time dry etching. In Embodiment 1, if low side walls 7a and 7b are to be formed by dry over-etching in the step shown in FIG. 2(b), the thickness of the isolation 2a is largely reduced, so that its an isolation function can be degraded. Therefore, the low side walls 7a and 7b are formed by wet etching in Embodiment 1, but the wet etching is inferior to the dry etching in view of control of the shape of the side walls. In contrast, in this embodiment, while avoiding the degradation of the isolation function of the isolation 2a, the side walls 7a and 7b can be formed by the dry etching that can well control the shape of an etched material.

In this embodiment, it is preferred that the height of the L-shaped side walls 7a and 7b is ⅘ or less of that of the polysilicon electrode 4a and the polysilicon wire 4b in view of the decrease of the resistance values. However, since fluctuation on the height of the side walls can be minimized in this embodiment in particular, the effect to reduce the resistance values can be exhibited to some extent even when the height of the side walls exceeds ⅘ of that of the polysilicon film.

(Embodiment 6)

A semiconductor device of a sixth embodiment will now be described referring to FIGS. 12, 13(a) through 13(e) and 14(a) through 14(e).

Figure 12:
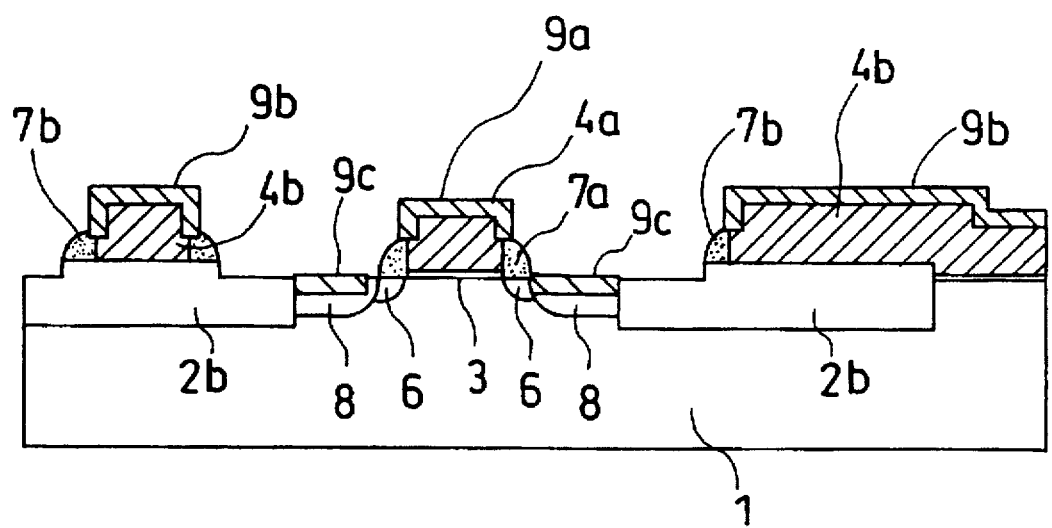
FIG. 12 is a sectional view of a semiconductor device according to a sixth embodiment of the invention.

FIG. 12 shows the sectional structure of the semiconductor device of this embodiment. The structure of the present semiconductor device is basically the same as that of the semiconductor device of Embodiment 1 shown in FIG. 1, and hence, like reference numerals are used to refer to like elements used in FIG. 1, and the description is omitted. In this embodiment, the isolation 2a formed out of the LOCOS film in Embodiment 1 is replaced with an an isolation 2b formed out of a silicon oxide film by a trench an isolation method. Also in this embodiment, the polysilicon electrode 4a and the polysilicon wire 4b have the same width and thickness, are made of the same kind of material and include the same kind of impurity as those adopted in Embodiment 1. The materials and the thickness of the side walls 7a and 7b and the gate oxide film 3 are also the same as those described in Embodiment 1. Furthermore, the electrode silicide layer 9a, the wire silicide layer 9b and the substrate silicide layer 9c are formed also in this embodiment out of the same material into the same thickness as in Embodiment 1.

In the semiconductor device of this embodiment, similarly to Embodiment 1, the resistance values can be further reduced because the silicide layers 9a and 9b cover the side surfaces of the polysilicon film.

Particularly in this embodiment, the isolation 2b formed by the trench an isolation method is used for partitioning the active area where the MOS transistor is formed. Therefore, the production procedure can be stabilized even when the material for the side walls 7a and 7b is the same silicon oxide film (a SiO$_2$ film deposited by the CVD) as that for the isolation 2b. In other words, in such a structure having the side walls 7a and 7b lower than the height of the polysilicon film, it is necessary to conduct over-etching to reduce the height of the side walls in the anisotropic etching step for forming the side walls. In this step, even when an an isolation insulating film (for example, a silicon oxide film) is etched simultaneously with the over-etching of the side walls, the etched area can be avoided from extending in the horizontal direction (i.e., the width of the isolation insulating film is avoided from being reduced) owing to its vertical shape. Thus, there is no fear of reducing voltage resistance of the isolation (i.e., of causing an isolation leakage).

In addition, in a semiconductor device mounting a refined MOS transistor with a small gate length, an isolation formed by the LOGOS method causes more problems such as a bird's beak as compared with an isolation having a trench structure. Therefore, the trench type an isolation is advantageous not only in improving the element integration of an LSI but also in providing a stable procedure for reducing the height of the side walls, and thus, together with the effect caused by silicidating part of the both sides of the polysilicon film, remarkable effects can be exhibited.

In this embodiment, the silicidated portions of the side surfaces of the polysilicon film constituting the polysilicon electrode 4a and the polysilicon wire 4b has a length of 130 nm. However, the thicker the polysilicon film becomes, or the lower the side walls 7a and 7b become, the larger the silicidated area of the polysilicon film becomes. Therefore, the effect can be remarkably exhibited, so that the resistance values of the gate electrode and the gate wire can be further reduced.

In this embodiment, the silicide layer is formed out of a TiSi$_2$ film, but the TiSi$_2$ film can be replaced with a CoSi$_2$ film, a NiSi film, a WSi film, a PtSi$_2$ film or the like.

Furthermore, although the side walls 7a and 7b are formed out of a SiO₂ film in this embodiment, they can be formed out of a silicon nitride film or another insulating film.

In addition, this embodiment is not limited to the specific values described herein of the width and the thickness of the polysilicon film constituting the polysilicon electrode 4a and the polysilicon wire 4b, the width and the height of the side walls 7a and 7b, the thickness of the TiSi₂ film constituting the silicide layers 9a through 9c, and the like.

Now, the production method for the semiconductor device shown in FIG. 12 will be described referring to FIGS. 13(a) through 13(e) and 14(a) through 14(e).

Figure 13A:
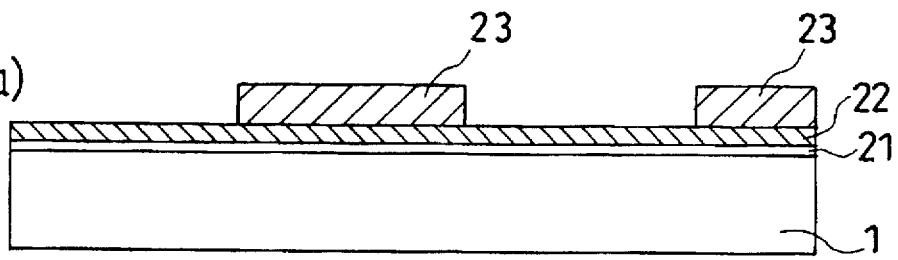
FIGS. 13(a) through 13(e) are sectional views for showing the production procedure for the semiconductor device of FIG. 12 up to the formation of an isolation.

First, as is shown in FIG. 13(a), an underlying oxide film 21 and a silicon nitride film 22, which works as an etching stopper in flattening a silicon oxide film for embedding a trench, are deposited on the silicon substrate 1 in order to form the trench type an isolation. Then, a resist film 23 having an opening corresponding to an area for forming a trench is formed on the silicon nitride film 22.

Figure 13B:
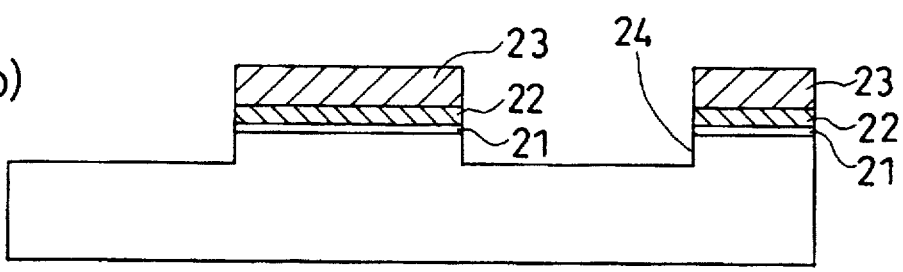

Next, as is shown in FIG. 13(b), by using the resist film 23 as a mask, the silicon nitride film 22 and the underlying oxide film 21 are etched, and the silicon substrate 1 is also vertically etched, thereby forming a trench 24 with a depth of approximately 300 nm.

Figure 13C:
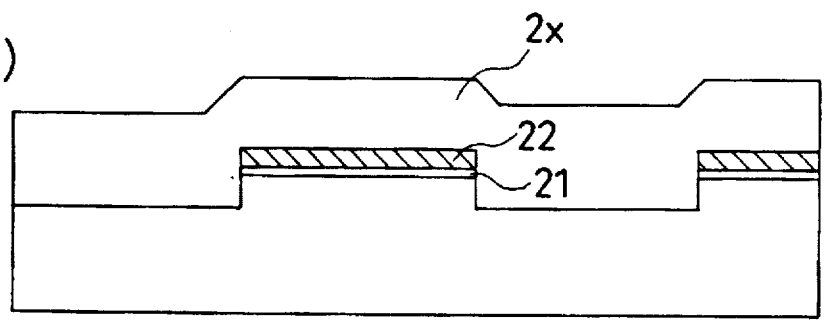

Then, as is shown in FIG. 13(c), the resultant substrate is slightly thermally oxidized, and then, a silicon oxide film 2x having a thickness of approximately 1 μm for embedding the trench 24 is formed on the entire surface of the resultant substrate by the CVD method.

Figure 13D:
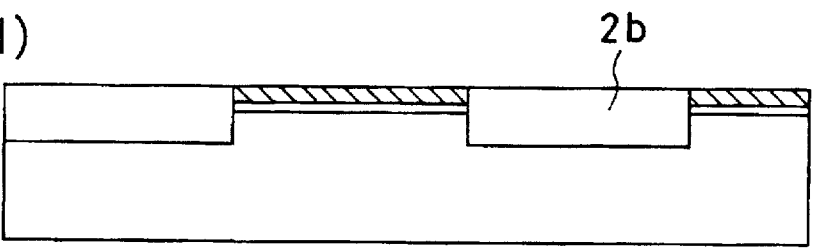

Then, as is shown in FIG. 13(d), the silicon oxide film 2x for embedding is flattened by a CMP method, and simultaneously the isolation 2b is patterned from the silicon oxide film 2x. At this point, the silicon nitride film 22 is used as an etching stopper in flattening in this embodiment, but the silicon nitride film 22 can be replaced with a polysilicon film. Also, instead of adopting the CMP method for flattening, it is possible to deposit and etch back a resist film.

Figure 13E:
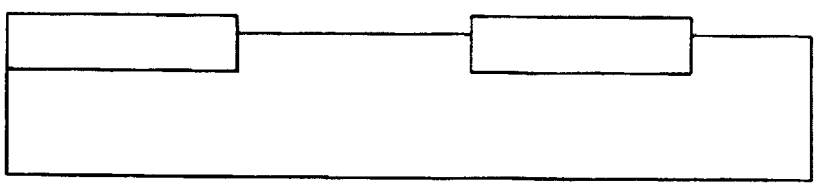

Next, as is shown in FIG. 13(e), the silicon nitride film 22 used as an etching stopper and the underlying oxide film 21 are removed by etching.

Figure 14A:
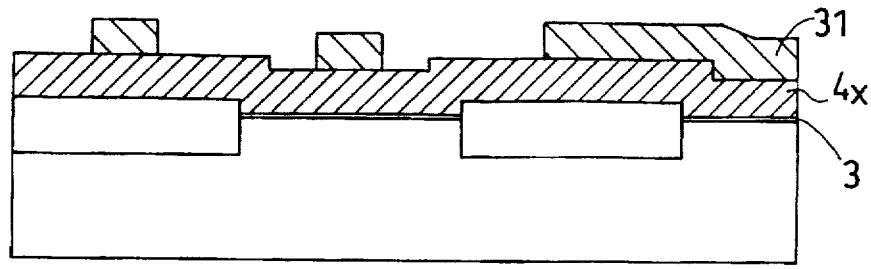
FIGS. 14(a) through 14(e) are sectional views for showing the production procedure for the semiconductor device of FIG. 12 after the formation of the isolation.

Then, as is shown in FIG. 14(a), after conducting gate oxidation, a polysilicon film 4x is deposited, and a resist film 31 for patterning a gate electrode is formed. In this embodiment, the gate oxide film 3 has a thickness of 9 nm and the polysilicon film 4x has a thickness of 330 nm.

Figure 14B:
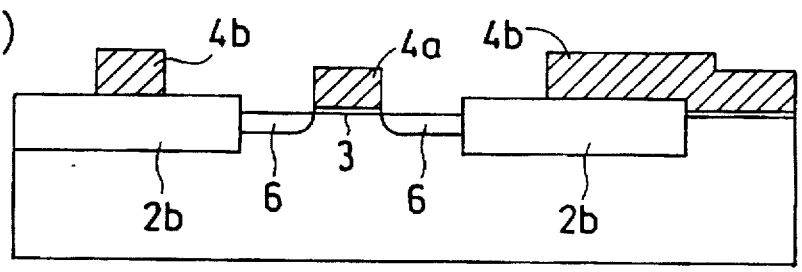

Then, as is shown in FIG. 14(b), by using the resist film 31 as a mask, etching is conducted to pattern the polysilicon film 4x and the gate oxide film 3, thereby forming the polysilicon electrode 4a having a gate length of approximately 0.35 μm and the polysilicon wire 4b. After this, by using the polysilicon electrode 4a, the polysilicon wire 4b and the isolation 2b as masks, the impurity ions are injected into the silicon substrate 1 at a low concentration, thereby forming the low concentration source/drain region 6.

Figure 14C:
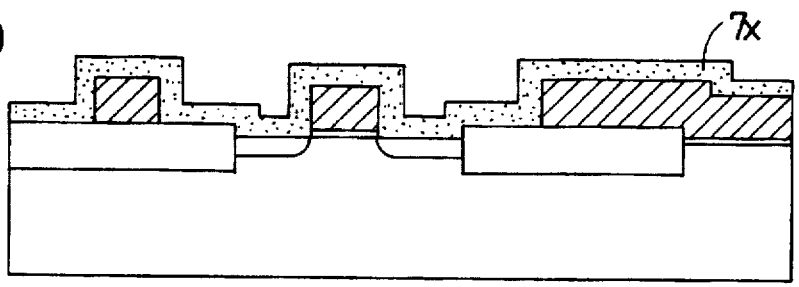

Next, as is shown in FIG. 14(c), a silicon oxide film 7x for forming the side walls is deposited on the resultant substrate 1. In this embodiment, the silicon oxide film 7x has a thickness of 120 nm, which is much thinner than the thickness of the silicon oxide film for forming the side walls in Embodiment 1 (i.e., 350 nm). This is because the side walls are formed by strongly anisotropic dry etching in the subsequent step.

Figure 14D:
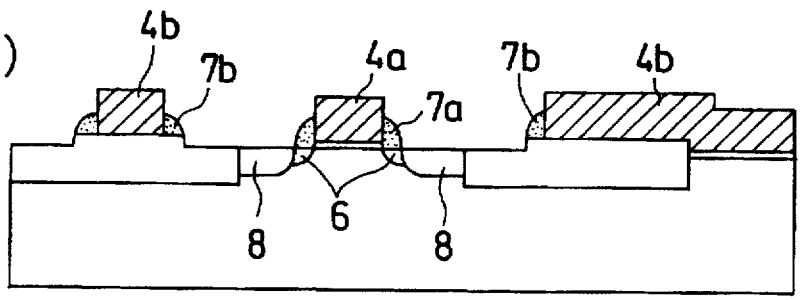

Then, as is shown in FIG. 14(d), the silicon oxide film 7x is subjected to the anisotropic etching, thereby forming the electrode side walls 7a and the wire side walls 7b on the both sides of the polysilicon electrode 4a and the polysilicon wire 4b, respectively.

In this embodiment, the extent of over-etching in the dry etching is large so The to reduce the height of the side walls. The height of the side walls 7a and 7b is 200 nm (which corresponds to etching of the oxide film by 250 nm), and thus, the height is smaller than the thickness of the polysilicon film 7x. Through this over-etching for reducing the height of the side walls, part of the isolation 2b is also etched. However, the side surfaces of the isolation 2b having the trench structure extend in the horizontal direction, and the top surface of the isolation is higher than the gate oxide film 3 by the thickness of the silicon nitride film 22 serving as an etching stopper. Therefore, even when part of the isolation 2b is etched to some extent, the width of a portion of the isolation 2b having an isolation function is not reduced. Thus, unlike the isolation formed by the LOCOS method, the problems such as leakage caused by the reduction of its width through the over-etching can be avoided. After this, by using the polysilicon electrode 4a, the polysilicon wire 4b, the electrode side walls 7a, the wire side walls 7b and the isolation 2b as masks, the impurity ions are injected into the silicon substrate 1 at a high concentration, and an annealing treatment is conducted, thereby forming the high concentration source/drain region 8. Also, the area of the low concentration source/drain region 6 is defined by the formation of the high concentration source/drain region 8.

Figure 14E:
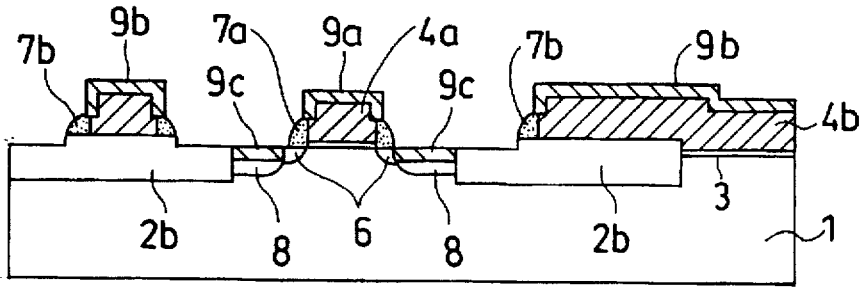

Next, as is shown in FIG. 14(e), the same procedure as is shown in FIGS. 2(c) through 2(f) of Embodiment 1 is conducted, so that silicon contained in the polysilicon electrode 4a, the polysilicon wire 4b and the high concentration source/drain region 8 is allowed to react with titanium, thereby forming the silicide layers made of a TiSi₂ film. Thereafter, an interlayer insulating film is deposited and flattened, a contact hall is formed, a metal wire film is deposited, a metal wire is formed, so as to complete an LSI.

In this manner, the MOS transistor shown in FIG. 13 can be produced, and thus, a polysilicon electrode and a polysilicon wire with low resistivity can be formed with ease. The side walls of this embodiment are formed out of a silicon oxide (SiO₂) film, but another nitride film or another material can be used instead.

In this embodiment TiSi₂ is used as a silicide material, but another material such as CoSi₂, NiSi and PtSi can be used instead.

(Embodiment 7)

A semiconductor device according to a seventh embodiment will now be described referring to FIGS. 15, 16(a) through 16(e) and 17(a) through 17(e).

Figure 15:
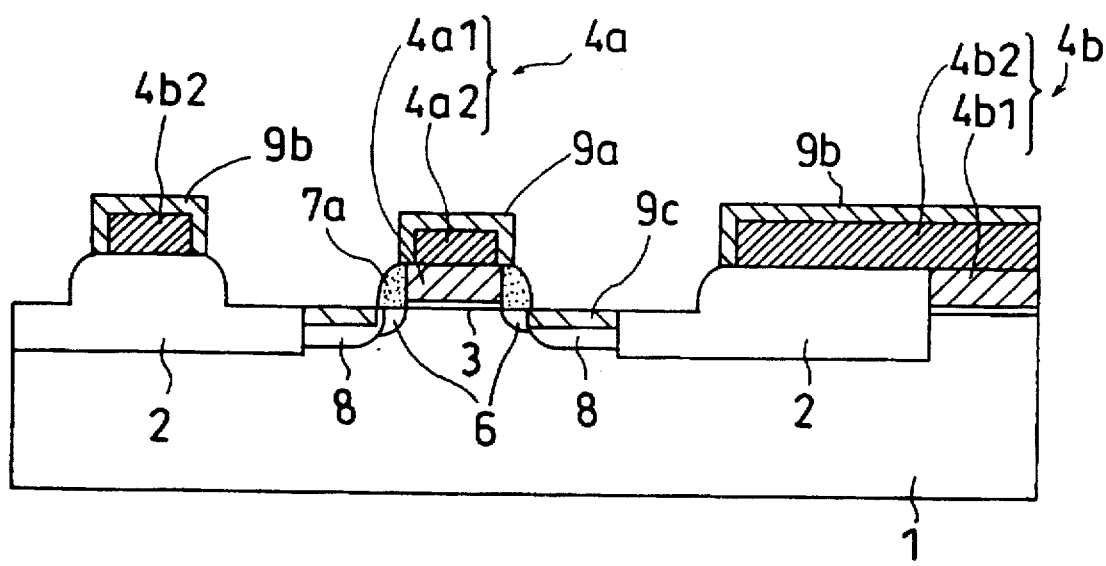
FIG. 15 is a sectional view of a semiconductor device according to a seventh embodiment of the invention.

FIG. 15 shows an exemplified sectional structure of a MOS transistor of Embodiment 7. In FIG. 15, like reference numerals are used to refer to like elements used in Embodiment 6 shown in FIG. 12, and the description is omitted.

In this embodiment, unlike Embodiment 6, a first polysilicon electrode 4a1 and a second polysilicon electrode 4a2 thereon are formed in the active area. On the trench type isolation 2b formed in an area excluding the active area, a second polysilicon wire 4b2 alone is provided and a first polysilicon wire 4b1 is not formed, while on a portion of the silicon substrate 1 where the polysilicon film does not serve as a gate, both the first polysilicon wire 4b1 and the second polysilicon wire 4b2 are formed. Substantially the entire side surfaces of the first polysilicon electrode 4a1 are covered with the electrode side walls 7a. On the top surface and the side surfaces of the second polysilicon electrode 4a2 is formed the electrode silicide layer 9a, on the top surface and the side surfaces of the second polysilicon wire 4b2 is formed the wire silicide layer 9b, and on the high concentration source/drain region 8 is formed the substrate silicide layer 9c. The first and second polysilicon electrodes 4a1 and 4a2 and the electrode silicide layer 9a together form a gate electrode, and the first and second polysilicon wires 4b1 and 4b2 and the wire silicide layer 9b together form a gate wire.

As will be described below, in the production procedure for the transistor having this structure, the polysilicon film constituting the first polysilicon electrode 4a1 and the first polysilicon wire 4b1 is deposited before forming the trench type isolation, thereby allowing the top surface of the first polysilicon electrode 4a1 and the first polysilicon wire 4b1 on the active area to have the same height as that of the isolation 2b. Therefore, the second polysilicon wire 4b2 formed thereon has no steps, resulting in stabilizing the formation of the transistor and improving the reliability of the polysilicon wire.

In the present semiconductor device having the aforementioned structure, since the second polysilicon electrode 4a2 and the second polysilicon wire 4b2 of the MOS transistor are respectively provided with the silicide layers 9a and 9b in contact with the top surfaces and part of the side surfaces thereof, the resistance values of the gate electrode and the gate wire can be reduced as in Embodiment 1. In addition, since the isolation 2b formed by the trench isolation method is adopted to partition the active area where the MOS transistor is formed, the width of the isolation 2b is prevented from being reduced even when the material for the side walls 7a and 7b is a silicon oxide film (i.e., a silicon oxide film deposited by the CVD) as in Embodiment 1. As a result, this embodiment can provide a stable production procedure which can prevent the isolation voltage resistance from decreasing.

Furthermore, in this embodiment, the polysilicon electrode has a double-layered structure including two polysilicon films. Therefore, when, for example, the first polysilicon electrode 4a1 is formed out of a polysilicon film including a high concentration of impurity (such as high concentration n+polysilicon) and the second polysilicon electrode 4a2 is formed out of a polysilicon film including a low concentration of impurity, the electrode silicide layer 9a can be advantageously stably formed. A polysilicon film including a low concentration of impurity is preferred for stable formation of the silicide layer because the formation of the silicide layer is inhibited by arsenic (As) or phosphorus (P) used as the impurity, and hence, a silicide layer doped with a high concentration of impurity generally has increased sheet resistance. Accordingly, when the first polysilicon electrode 4a1 is formed out of a high concentration n+polysilicon film, and the second polysilicon electrode 4a2 is formed out of a low concentration n– polysilicon film, and the silicide layer 9a is formed on the top surface and the side surfaces of the second polysilicon electrode 4a2, it is possible to form a gate electrode having very low resistance. This effect is also exhibited by a combination of the polysilicon wire 4b including the first and second polysilicon wires 4b1 and 4b2 and the wire silicide layer 9b.

Similarly to Embodiment 1, the silicide layers 9a, 9b and 9c are made of a TiSi$_2$ film in this embodiment, but TiSi$_2$ can be replaced with another silicide such as CoSi$_2$, NiSi, WSi and PtSi$_2$. Furthermore, the side walls 7a and 7b are made of SiO$_2$ in this embodiment, but SiO$_2$ can be replaced with SiSN$_4$ or another material.

In addition, the present embodiment is not limited to the specific dimensions described herein such as the width and the thickness of the polysilicon film, the width and the height of the side wall, and the thickness of the silicide layer.

Also, the conductivity type of the impurity to be doped in the polysilicon film is described as the n-type in this embodiment, but can be the p-type.

Now, the production method for the semiconductor device of FIG. 15 will be described referring to FIGS. 16(a) through 16(e) and 17(a) through 17(e).

Figure 16A:
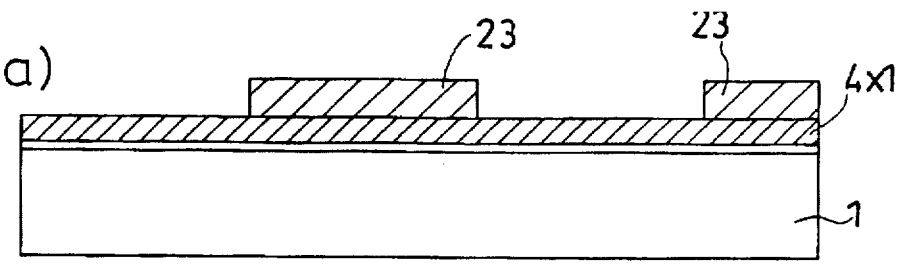
FIGS. 16(a) through 16(e) are sectional views for showing the production procedure for the semiconductor device of FIG. 15 up to the formation of a second polysilicon film.

First, as is shown in FIG. 16(a), the gate oxide film 3 and a first polysilicon film 4x1 are deposited on the silicon substrate 1, and a resist film 23 having an opening corresponding to a trench forming area is formed thereon. The gate oxide film 3 and the first polysilicon film 4x1 are also used as etching stoppers for flattening an oxide film for embedding the trench in the subsequent step. In this embodiment, the gate oxide film 3 has a thickness of 9 nm, and the first polysilicon film 4x1 has a thickness of 200 nm.

Figure 16B:
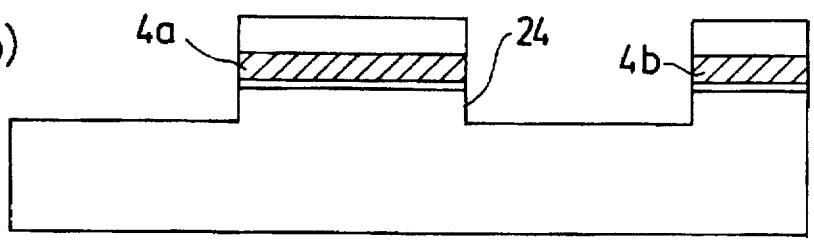

Then, as is shown in FIG. 16(b), by using the resist film 23 as a mask, the first polysilicon film 4x1 and the gate oxide film 3 are etched, and the silicon substrate 1 is further etched in the vertical direction, thereby forming a trench 24.

Figure 16C:
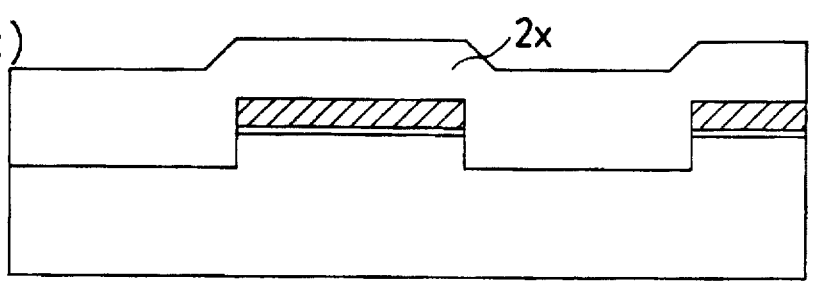

Next, as is shown in FIG. 16(c), after the surface of the substrate 1 is slightly thermally oxidated, a silicon oxide film 2x for embedding the trench is deposited on the entire surface of the substrate by the CVD.

Figure 16D:
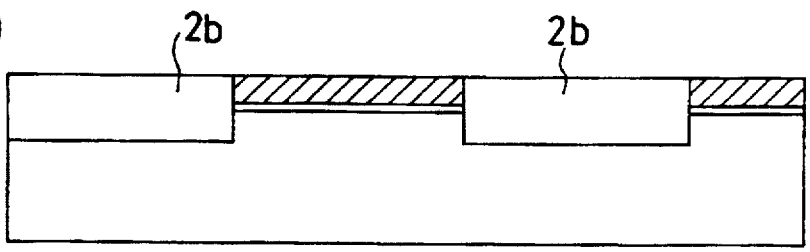

Then, as is shown in FIG. 16(d), the silicon oxide film 2x is flattened by the CMP and simultaneously the isolation 2b is patterned from the silicon oxide film 2x. At this point, the first polysilicon film 4x1 works as an etching stopper in the flattening step. The CMP for flattening can be replaced with another flattening method such as deposition and etch back of a resist film. Furthermore, the first polysilicon film 4x1 is doped with impurity (p+type impurity) after the deposition of the first polysilicon film 4x1 in the step of FIG. 16(a) or after the flattening step shown in FIG. 16(d).

Figure 16E:
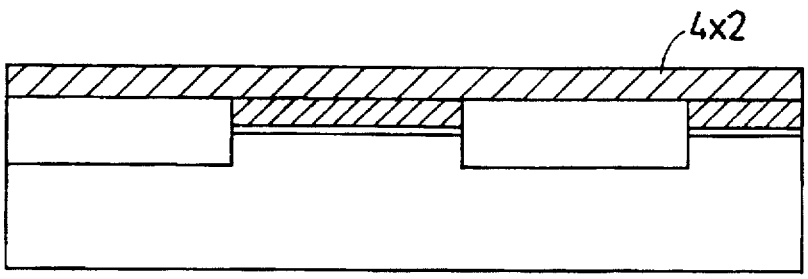

Next, as is shown in FIG. 16(e), a second polysilicon film 4x2 is deposited on the resultant substrate. The second polysilicon film 4x2 of this embodiment has a thickness of 130 nm. Then, the second polysilicon film 4x2 is doped with a low concentration of impurity (n– type impurity).

Figure 17A:
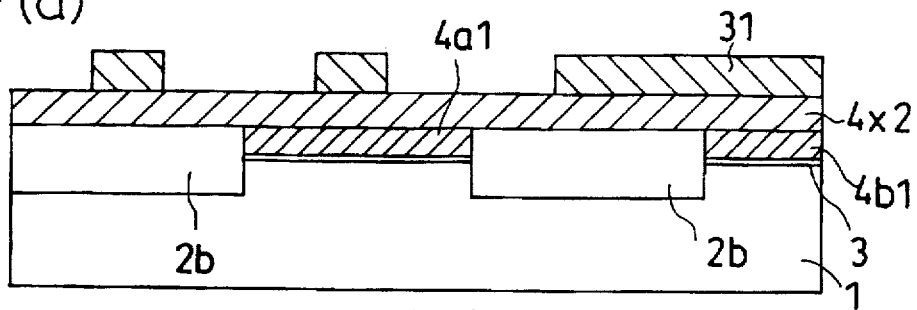
FIGS. 17(a) through 17(e) are sectional views for showing the production procedure for the semiconductor device of FIG. 15 after the formation of the second polysilicon film.

Then, as is shown in FIG. 17(a), a resist film 31 for patterning the gate electrode is formed on the second polysilicon film 4x2.

Figure 17B:
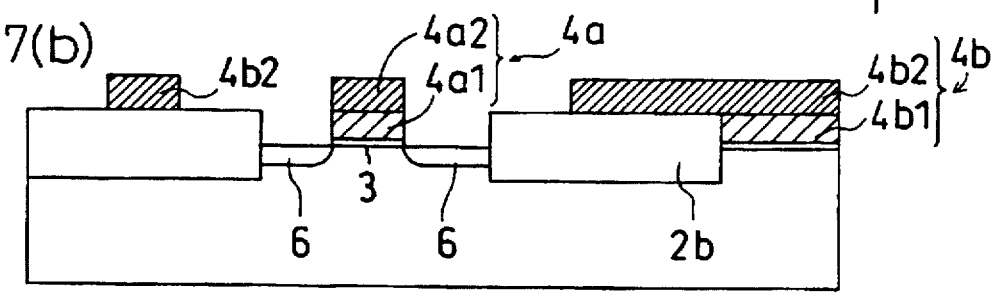

Next, as is shown in FIG. 17(b), the first and second polysilicon film 4x1 and 4x2 and the gate oxide film 3 are made into a pattern by using the resist film 31, thereby forming the first and second polysilicon electrodes 4a1 and 4a2 having a gate length of approximately 0.35 μm and the first and second polysilicon wires 4b1 and 4b2. Then, by using the polysilicon electrodes 4a1 and 4a2, the polysilicon wires 4b1 and 4b2 and the isolation 2b as masks, the impurity ions are injected into the silicon substrate 1 at a low concentration, thereby forming the low concentration source/drain region 6.

Figure 17C:
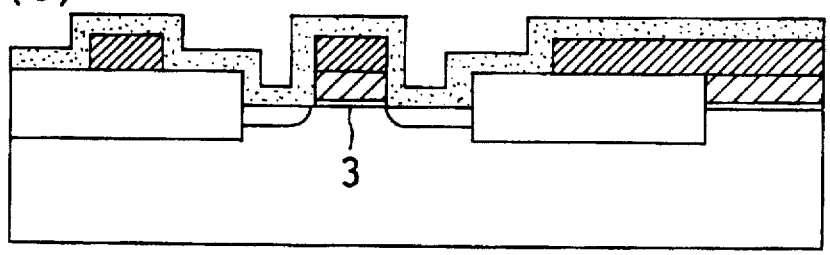

Next, as is shown in FIG. 17(c), a silicon oxide film 7x having a thickness of approximately 120 nm is deposited for the formation of the side walls.

Figure 17D:
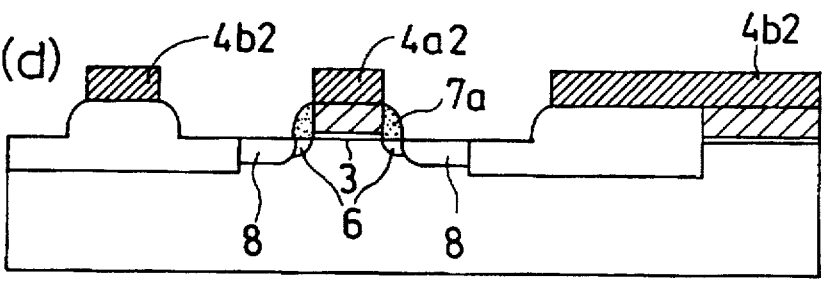

Then, as is shown in FIG. 17(d), the silicon oxide film 7x is subjected to anisotropic etching, thereby forming the electrode side walls 7a on the both side surfaces of the first polysilicon electrode 4a1. In this embodiment, almost no side wall is formed on the side surfaces of the second polysilicon wire 4b2 formed on the isolation 2b.

After this, by using the polysilicon electrodes 4a1 and 4a2, the polysilicon wires 4b1 and 4b2, the electrode side walls 7a, the wire side walls 7b and the isolation 2b as masks, the impurity ions are injected into the silicon substrate 1 at a high concentration and an annealing treatment is further conducted, thereby forming the high concentration source/drain region 8. This results in defining the area of the low concentration source/drain region 6.

Figure 17E:
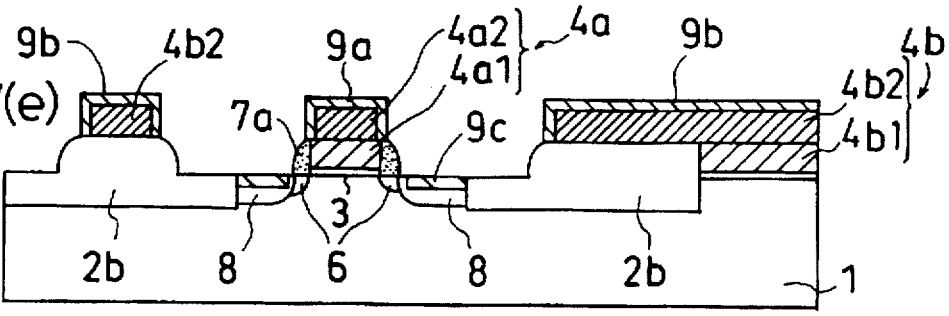

Next, in the step shown in FIG. 17(e), the same procedure as that shown in FIGS. 1(c) through 1(f) is conducted, thereby forming the silicide layers 9a through 9c. Then, an interlayer insulating film is deposited and flattened, a contact hall is formed, a metal wire film is deposited, and a metal wire is formed, thereby completing an LSI.

In this manner, the MOS transistor having the structure shown in FIG. 15 can be produced, and thus, a polysilicon electrode and a polysilicon wire with low resistance can be produced with ease. In comparison with the production procedure of Embodiment 5 in particular, in making the pattern of the polysilicon electrodes 4a1 and 4a2 and the polysilicon wires 4b1 and 4b2, the groundwork thereof is completely flat in this embodiment, and hence, the patterning property is advantageously improved.

(Embodiment 8)

A semiconductor device according to an eighth embodiment will now be described referring to FIGS. 18 and 19(a) through 19(f).

Figure 18:
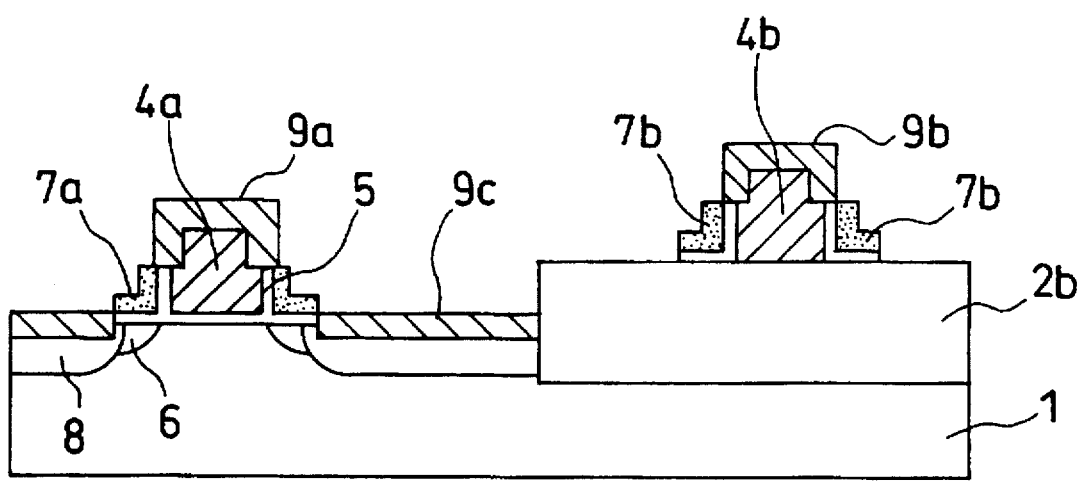
FIG. 18 is a sectional view of a semiconductor device according to an eighth embodiment of the invention.

FIG. 18 is a sectional view of the semiconductor device of this embodiment. As is shown in FIG. 18, this semiconductor device is provided with the isolation 2b having a trench structure, and is further provided with L-shaped side walls 7a and 7b made of insulating films on the side surfaces of the polysilicon electrode 4a and the polysilicon wire 4b with the protection oxide film 5 sandwiched therebetween. Except for this, the semiconductor device has the same structure as that of FIG. 8.

The present semiconductor device can exhibit the same effect as that of Embodiment 6. In addition, this semiconductor device is advantageous in preventing the thickness of the isolation 2b having the trench structure from decreasing when over-etching is conducted for the formation of the L-shaped side walls 7a and 7b as described below. In other words, the isolation function of the isolation 2b can be definitely maintained without making a large step between the isolation 2b and the substrate surface in the active area. Accordingly, a height difference between the polysilicon electrode 4a and the polysilicon wire 4b can be reduced, thereby improving patterning accuracy of the polysilicon electrode 4a.

Now, the production procedure for the semiconductor device of FIG. 18 will be described referring to FIGS. 19(a) through 19(f).

Figure 19A:
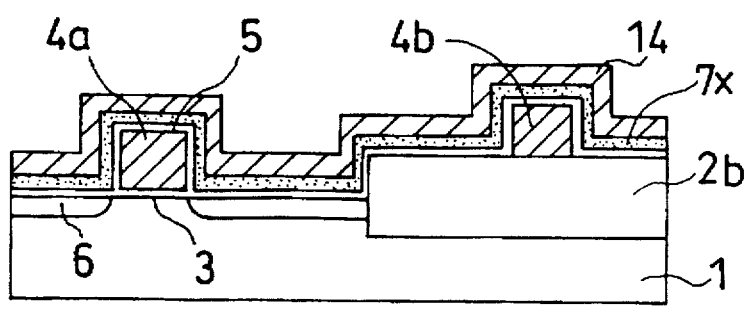
FIGS. 19(a) through 19(f) are sectional views for showing the production procedure for the semiconductor device of FIG. 18.

First, in the step shown in FIG. 19(a), the polysilicon electrode 4a is formed on the gate oxide film 3 in the active area of the silicon substrate 1, and the polysilicon wire 4b is formed on the isolation 2a. Under this condition, the protection oxide film 5 is deposited on the entire surface of the substrate, and by using the polysilicon electrode 4a and the protection oxide film 5 on the both sides of the polysilicon electrode 4a as masks, impurity ions are injected at a low concentration, thereby forming the low concentration source/drain region 6. Then, on the protection oxide film 5 are deposited a silicon nitride film 7x for the formation of the side walls and a polysilicon film 14 as a mask both by the CVD. At this point, the polysilicon electrode 4a, the polysilicon wire 4b, the protection oxide film 5, the silicon nitride film 7x and the polysilicon film 14 have the same dimensions as those adopted in Embodiment 5, and the isolation 2b is identical to that of Embodiment 6 in the depth of the trench and the thickness thereof.

Figure 19B:
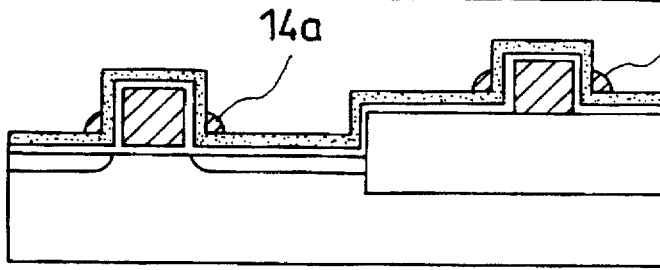
Figure 19C:
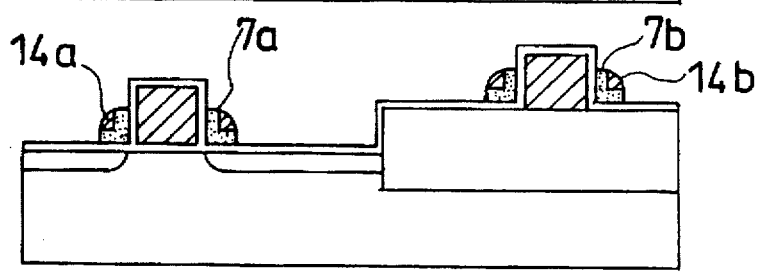

Next, as is shown in FIG. 19(b), the polysilicon film 14 is subjected to over-etching by the RIE, so as to be removed most of the portions thereof excluding corner portions. Through this treatment, the electrode polysilicon masks 14a and the wire polysilicon masks 14b are formed at the corners near the bottoms of the polysilicon electrode 4a and the polysilicon wire 4b, respectively. At this point, the etch selectivity between the polysilicon film 14 and the silicon nitride film 7x is large. When there is a large step between the isolation 2b and the silicon substrate surface, part of the polysilicon film 14 can remain on the side surfaces of the isolation 2b. However, when the step is not very large as in this embodiment, the polysilicon film 14 does not remain on the side surfaces of the isolation 2b.

Next, in the steps shown in FIGS. 19(c) through 19(f), the same procedure as that shown in FIG. 10(c) through 10(f) of Embodiment 5 are conducted. After this, an interlayer insulating film is deposited and flattened, a contact hall is formed, a metal wire film is deposited, and a metal wire is formed, so as to complete an LSI.

Thus, the semiconductor device mounting the MOS transistor having the salicide structure as shown in FIG. 18 can be produced with ease.

Figure 19D:
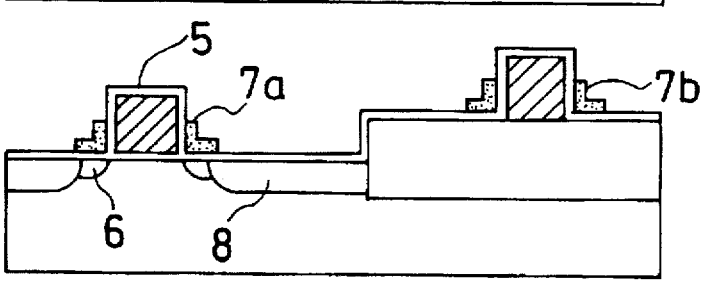
Figure 19E:
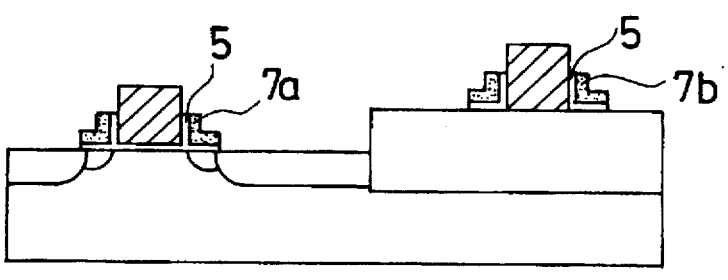
Figure 19F:
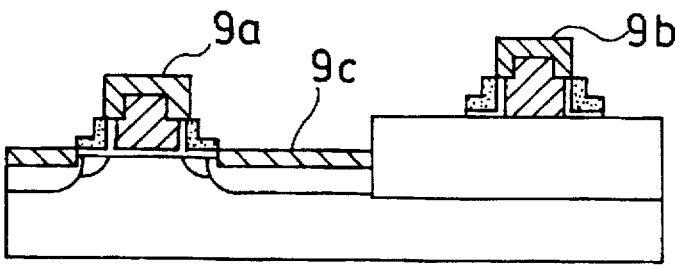

In the production method of this embodiment in particular, since the protection oxide film 5 is formed on the isolation 2b and the active area of the silicon substrate in the step shown in FIG. 19(d), the thickness of the isolation 2b is not reduced during the formation of the side walls 7a and 7b. Accordingly, it is possible to reduce the size of the step between the isolation 2b and the silicon substrate 1, resulting in improving the patterning accuracy of the gate.

(Embodiment 9)

A semiconductor device according to a ninth embodiment will now be described referring to FIGS. 20(a) through 20(e) and 21(a) through 21(e). This embodiment is similar to Embodiment 8 in adopting the isolation with a trench structure and the L-shaped side walls. In this embodiment, however, the isolation 2b is formed at the same height as the active area of the silicon substrate as shown in FIG. 20(e), and the groundwork of the polysilicon electrode 4a and the polysilicon wire 4b is completely flat.

Figure 20A:
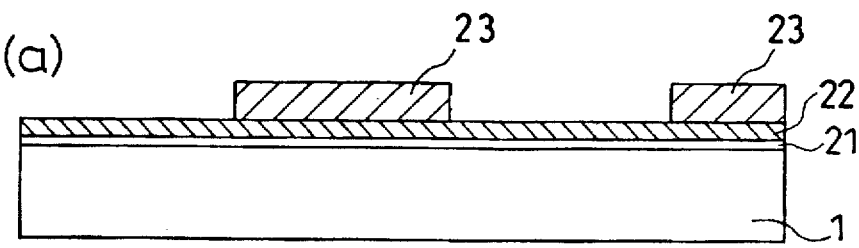
FIGS. 20(a) through 20(e) are sectional views for showing the production procedure for a semiconductor device according to a ninth embodiment of the invention up to the formation of an isolation.
Figure 20B:
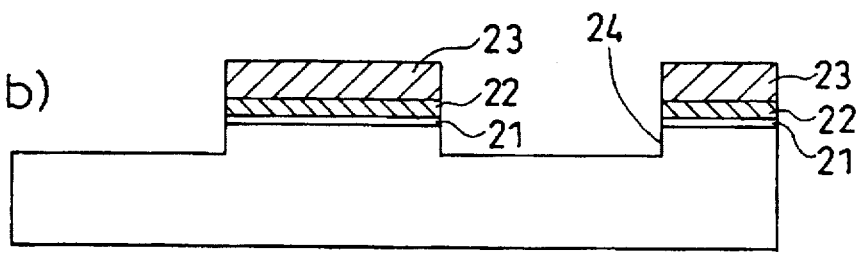
Figure 20C:
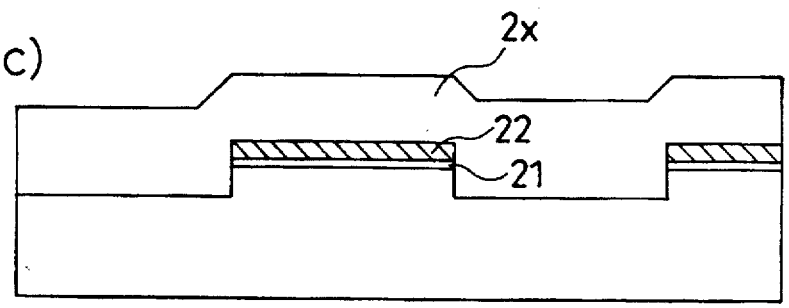
Figure 20D:
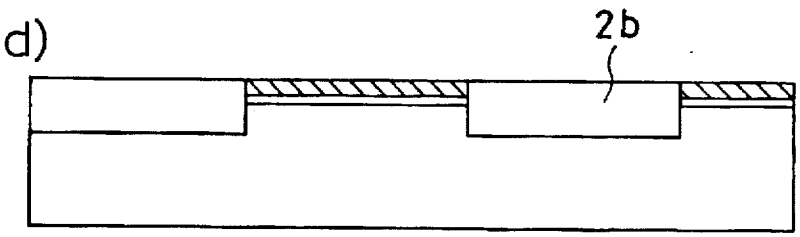
Figure 20E:
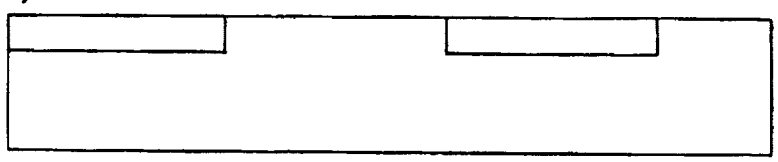
Figure 21A:
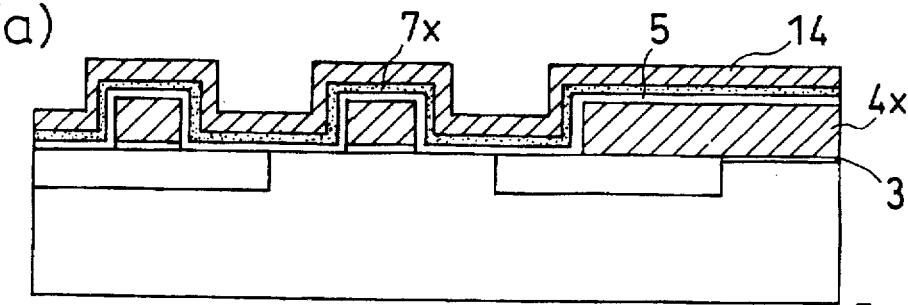
FIGS. 21(a) through 21(e) are sectional views for showing the production procedure for the semiconductor device of the ninth embodiment after the formation of the isolation.
Figure 21B:
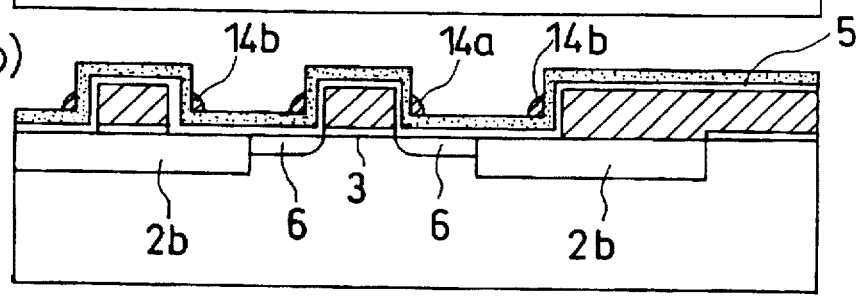
Figure 21C:
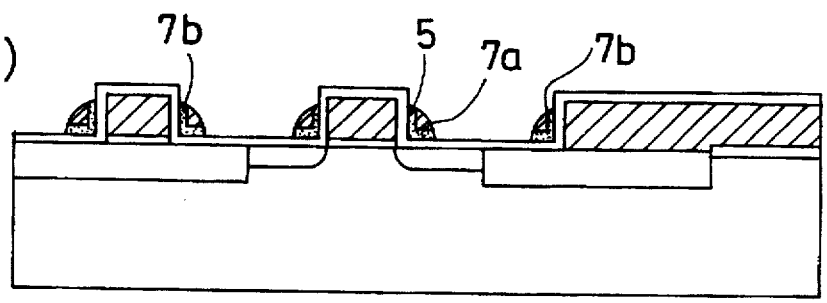
Figure 21D:
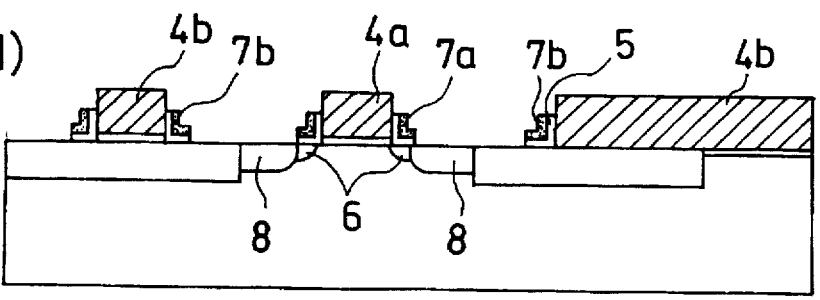
Figure 21E:
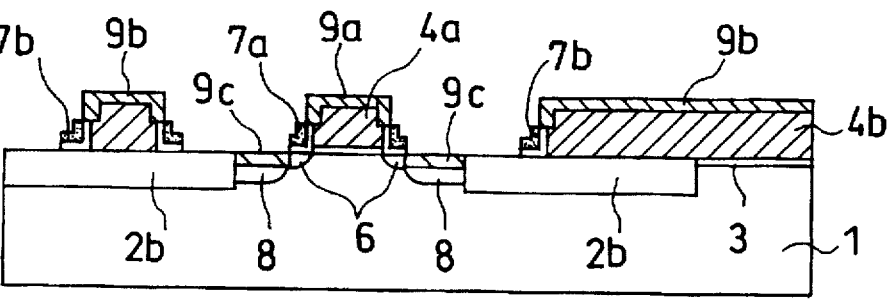
Figure 22:
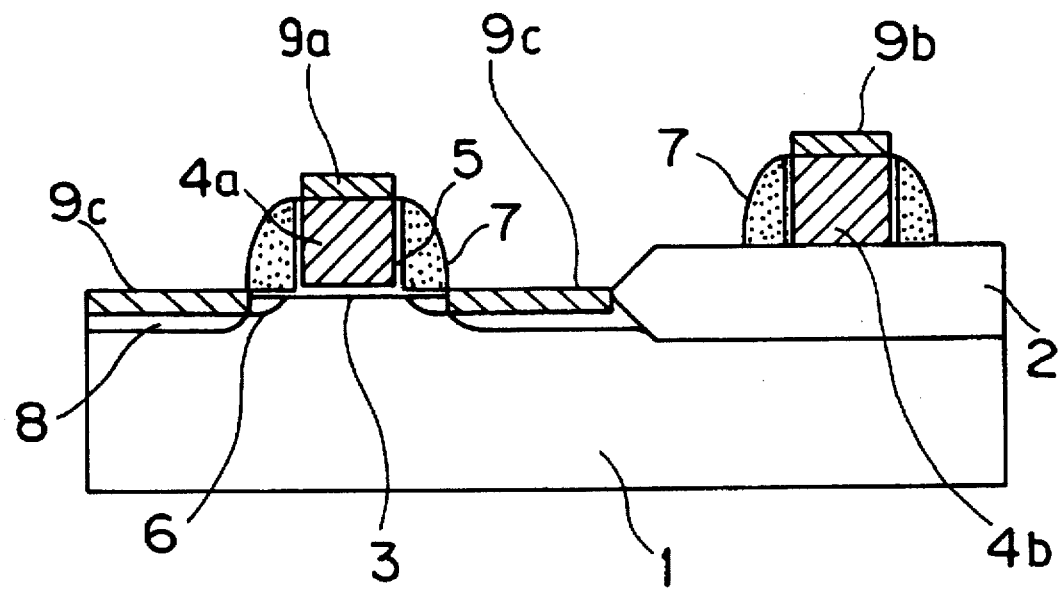
FIG. 22 is a sectional view of a semiconductor device having a conventional salicide structure.

First, in the steps shown in FIGS. 20(a) through 20(e), substantially the same procedure as shown in FIG. 13(a) through 13(e) of Embodiment 6 is conducted. In the step of FIG. 20(e) of this embodiment, however, the isolation 2b and the active area of the silicon substrate is made substantially even with each other. This can be easily realized by making the thickness of a silicon nitride film 22 small in the step of FIG. 20(a), and etching the isolation 2b simultaneously with the etching of the silicon nitride film 22 and an underlying oxide film 21 in the step of FIG. 20(e). Specifically, the thickness of the silicon nitride film 22 is previously defined in view of the etching ratio among each element. Alternatively, it is possible to further remove the silicon nitride film 22 and the underlying oxide film 21 from the condition shown in FIG. 20(d) by the CMP.

Then, in the steps shown in FIG. 21(a) through 21(e), the same procedure as that shown in FIG. 19(a) through 19(f) of Embodiment 8 is conducted. In this embodiment, however, the step corresponding to that of FIG. 19(d) is not shown.

The semiconductor of this embodiment has the same structure as that of Embodiment 8 except that there is no step between the top surface of the isolation 2b and the surface of the active area of the silicon substrate 1. Accordingly, this semiconductor device can exhibit substantially the same effect as that of Embodiment 8. In this embodiment in particular, since the isolation 2b and the active area of the silicon substrate 1 are completely even with each other in making the pattern of the polysilicon electrode 4a and the polysilicon wire 4b, the patterning accuracy can be extremely high.

What is claimed is:

1. A semiconductor device comprising:
   an active area formed in part of a semiconductor substrate;
   an isolation for surrounding the active area;
   a line-like polysilicon film formed at least on the active area, said polysilicon film forming a gate electrode, said gate electrode having a mid-section and a first and second end section, said mid-section having a vertical size larger than the vertical size of the first and second end sections;
   a pair of side walls comprising an insulating film formed on both side surfaces of the polysilicon film, said side walls being self-aligned with respect to the gate electrode, said side walls having a vertical size of ⅘ or less than the vertical size of the mid-section of the gate electrode;
   a silicide layer formed in contact with a top surface and portions of the side surfaces of the polysilicon film projecting from the side walls, and serving as the gate electrode on the active area together with the polysilicon film; and
   a source/drain region formed on the active area so as to be positioned on both sides of the polysilicon film.

2. The semiconductor device of claim 1,
   wherein the polysilicon film is formed on the active area and the isolation, and the polysilicon film on the isolation and the silicide layer on the isolation together form a wire.

3. The semiconductor device of claim 1,
   wherein the portions of the polysilicon film projecting from the side walls have a height to minimum linewidth ratio of ½ or more, and
   the silicide layer is formed by allowing silicidated portions from the both side surfaces of the polysilicon film to come in contact with each other at the center of a top surface of the polysilicon film.

4. The semiconductor device of claim 1,
   further comprising a second silicide layer formed in contact with the source/drain region.

5. The semiconductor device of claim 1,
   wherein the isolation is a trench type isolation, and a top surface of the isolation is higher in a step-wise manner than a top surface of the semiconductor substrate in the active area.

6. The semiconductor device of claim 5,
   wherein the polysilicon film has a double-layer structure, at least in the active area, including a first polysilicon film and a second polysilicon film deposited on the first polysilicon film, and
   the side walls have a height smaller than a total thickness of the first polysilicon film and the second polysilicon film.

7. The semiconductor device of claim 6,
   wherein on the isolation is formed a wire made of the second polysilicon film alone, and the top surface of the isolation is positioned at substantially the same height as a top surface of the first polysilicon film on the active area.

8. The semiconductor device of claim 6,
   wherein the first polysilicon film is doped with a first conductivity type impurity at a high concentration, and
   the second polysilicon film is doped with the first conductivity type impurity at a low concentration.

9. The semiconductor device of claim 1,
   wherein the side walls are made of a silicon nitride film represented by a general formula of $Si_xN_y$, and
   a protection oxide film is interposed between the silicon nitride film, and the polysilicon film or the semiconductor substrate.

10. A semiconductor device comprising:
    an active area formed in part of a semiconductor substrate;
    an isolation for surrounding the active area;
    a line-like polysilicon film formed at least on the active area, said polysilicon film forming a gate electrode, said gate electrode having a mid-section and a first and second end section, said mid-section having a vertical size larger than the vertical size of the first and second end sections;
    a pair of electrode side walls comprising L-shaped insulating films with a substantially constant thickness including vertical portions formed on side surfaces of the polysilicon film and horizontal portions extending from bottoms of the vertical portions in an opposite direction of the polysilicon film, said side walls being self-aligned with respect to the gate electrode, said side walls having a vertical size less than the vertical size of the mid-section of the gate electrode;
    a silicide layer formed in contact with a top surface of the polysilicon film and portions of the side surfaces of the polysilicon film projecting from the side walls, and serving as the gate electrode on the active area together with the polysilicon film; and
    a source/drain region formed on the active area so as to be positioned on both sides of the polysilicon film.

11. The semiconductor device of claim 10,
    wherein the polysilicon film is formed on the active area and the isolation, and the polysilicon film on the isolation and the silicide layer on the isolation together form a wire.

12. The semiconductor device of claim 10,
    wherein the portions of the polysilicon film projecting from the side walls have a height to minimum linewidth ratio of ½ or more, and
    the silicide layer is formed by allowing silicidated portions from the side surfaces of the polysilicon film to come in contact with each other at the center of a top surface of the polysilicon film.

13. The semiconductor device of claim 10,
    further comprising a second silicide layer formed in contact with the source/drain region.

14. The semiconductor device of claim 10,
    wherein the isolation is a trench type isolation, and a top surface of the isolation is higher in a step-wise manner than a top surface of the semiconductor substrate in the active area.

15. The semiconductor device of claim 14,
    wherein the polysilicon film has, at least in the active area, a double-layer structure including a first polysilicon film and a second polysilicon film deposited on the first polysilicon film, and the side walls have a height smaller than a total thickness of the first polysilicon film and the second polysilicon film.

16. The semiconductor device of claim 15, wherein on the isolation is formed a wire made of the second polysilicon film alone, and the top surface of the isolation is positioned at substantially the same height as a top surface of the first polysilicon film.

17. The semiconductor device of claim 15, wherein the first polysilicon film is doped with a first conductivity type impurity at a high concentration, and the second polysilicon film is doped with the first conductivity type impurity at a low concentration.

18. The semiconductor device of claim 10, wherein the side walls are made of a silicon nitride film represented by a general formula of $Si_xN_y$, and a protection oxide film is interposed between the silicon nitride film, and the polysilicon film or the semiconductor substrate.

* * * * *